US009461016B2

(12) United States Patent
Kariyazaki et al.

(10) Patent No.: US 9,461,016 B2
(45) Date of Patent: Oct. 4, 2016

(54) SEMICONDUCTOR DEVICE

(71) Applicant: Renesas Electronics Corporation, Koutou-ku, Tokyo (JP)

(72) Inventors: Shuuichi Kariyazaki, Tokyo (JP); Wataru Shiroi, Tokyo (JP); Ryuichi Oikawa, Tokyo (JP); Kenichi Kuboyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/967,463

(22) Filed: Dec. 14, 2015

(65) Prior Publication Data

US 2016/0218083 A1 Jul. 28, 2016

(30) Foreign Application Priority Data

Jan. 26, 2015 (JP) .................. 2015-012482

(51) Int. Cl.
*H01L 25/065* (2006.01)
*H01L 23/498* (2006.01)

(52) U.S. Cl.
CPC ..... *H01L 25/0655* (2013.01); *H01L 23/49811* (2013.01); *H01L 2225/0651* (2013.01); *H01L 2225/06506* (2013.01); *H01L 2225/06555* (2013.01)

(58) Field of Classification Search
CPC .............. H01L 2924/14; H01L 2924/01079; H01L 2924/01013; H01L 2924/01029; H01L 2924/01078; H01L 24/02; H01L 24/10; H01L 24/18; H01L 24/45–24/50
USPC ........................................ 257/773
See application file for complete search history.

(56) References Cited

U.S. PATENT DOCUMENTS

| 8,076,588 B2 | 12/2011 | Hirakawa |
| 8,653,676 B2 | 2/2014 | Kim et al. |
| 2009/0059641 A1 | 3/2009 | Jeddeloh |
| 2010/0330742 A1* | 12/2010 | Sugiyama ......... H01L 23/49833 438/107 |
| 2012/0187562 A1* | 7/2012 | Hisada ............. H01L 23/49811 257/738 |
| 2013/0137216 A1 | 5/2013 | Ito et al. |
| 2014/0001639 A1 | 1/2014 | Hiraishi et al. |

FOREIGN PATENT DOCUMENTS

| JP | 2008-153542 A | 7/2008 |
| JP | 2010-538358 T | 12/2010 |
| JP | 2013-138177 A | 7/2013 |
| JP | 2014-11169 A | 1/2014 |
| JP | 2014-11284 A | 1/2014 |

\* cited by examiner

*Primary Examiner* — Monica D Harrison
(74) *Attorney, Agent, or Firm* — Shapiro, Gabor and Rosenberger, PLLC

(57) ABSTRACT

To improve reliability of signal transmission of an interposer which couples between semiconductor chips. A reference potential wiring and a reference potential wiring are provided on both neighboring sides of a signal wiring provided in a first wiring layer of an interposer. Also, a reference potential wiring and a reference potential wiring are provided on both neighboring sides of a signal wiring provided in a second wiring layer of the interposer. Further, the signal wiring and the signal wiring cross each other in plan view. The reference potential wirings of the first wiring layer, and the reference potential wirings of the second wiring layer are coupled to each other at the periphery of their crossing portion.

15 Claims, 18 Drawing Sheets

SEMICONDUCTOR DEVICE

CROSS-REFERENCE TO RELATED APPLICATIONS

The disclosure of Japanese Patent Application No. 2015-012482 filed on Jan. 26, 2015 including the specification, drawings and abstract is incorporated herein by reference in its entirety.

BACKGROUND

The present invention relates to a semiconductor device, and to, for example, a technology effective when applied to a semiconductor device in which a plurality of semiconductor components such as semiconductor chips are electrically coupled to each other through an interposer.

There has been described in each of Japanese Unexamined Patent Application Publication No. 2010-538358 (Patent Document 1), Japanese Unexamined Patent Publication Laid-Open No. 2013-138177 (Patent Document 2), Japanese Unexamined Patent Publication Laid-Open No. 2014-11169 (Patent Document 3), U.S. Pat. No. 8,653,676 (Patent Document 4), and Japanese Unexamined Patent Publication Laid-Open No. 2014-11284 (Patent Document 5), a semiconductor device in which a plurality of semiconductor chips are electrically coupled to each other via an interposer.

Further, there has been described in Japanese Unexamined Patent Publication Laid-Open No. 2008-153542 (Patent Document 6), a multilayer wiring substrate in which signal wirings and ground wirings are alternately provided.

RELATED ART DOCUMENTS

Patent Documents

[Patent Document 1] Japanese Unexamined Patent Application Publication No. 2010-538358
[Patent Document 2] Japanese Unexamined Patent Publication Laid-Open No. 2013-138177
[Patent Document 3] Japanese Unexamined Patent Publication Laid-Open No. 2014-11169
[Patent Document 4] U.S. Pat. No. 8,653,676
[Patent Document 5] Japanese Unexamined Patent Publication Laid-Open No. 2014-11284
[Patent Document 6] Japanese Unexamined Patent Publication Laid-Open No. 2008-153542

SUMMARY

There has been known a technology of electrically coupling a plurality of semiconductor components to each other via an interposer. The width of each of a plurality of wirings formed in a wiring substrate or an interposer is limited by an aspect ratio with the thickness of the wiring. Therefore, when an interposer is mounted over a wiring substrate used as a basic material of a semiconductor package, each wiring pattern of the interposer is formed by a wiring material thinner than the wiring substrate, thus making it possible to improve the wiring densities of the wirings formed in the interposer. Further, when a plurality of wiring layers are provided in the interposer, the number of wirings which couple between the semiconductor components can further be increased. It has however turned out that a problem arises from the viewpoint of the reliability of signal transmission when the wiring densities of the wirings of the interposer increase.

Other problems and novel features will be apparent from the description of the present specification and the accompanying drawings.

A semiconductor device according to one aspect of the present invention is equipped with first and second semiconductor chips which are mounted over an interposer mounted over a wiring substrate and electrically coupled to each other via the interposer. Further, a first wiring layer and a second wiring layer that the interposer has are provided with a first signal wiring and a second signal wiring electrically isolated from each other. Moreover, reference potential wirings are respectively formed on both neighboring sides of the first signal wiring and the second signal wiring. Besides, the first signal wiring provided in the first wiring layer, and the second signal wiring provided in the second wiring layer cross each other in plan view. The reference potential wiring of the first wiring layer, and the reference potential wiring of the second wiring layer are coupled at the periphery of their crossing portion.

According to one aspect of the present invention, the reliability of a semiconductor device can be improved.

Figure 1:
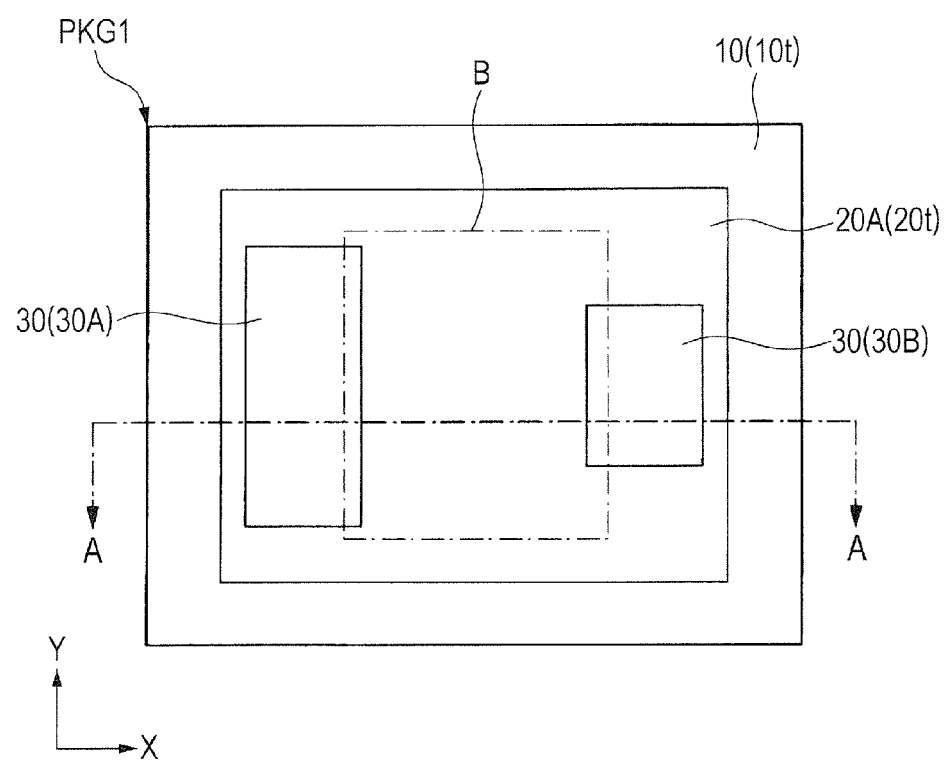
FIG. 1 is a top diagram of a semiconductor device according to one embodiment.

DETAILED DESCRIPTION (Description of Description Form, Basic Terms and Usage in the Present Application)

In the present application, if necessary for the sake of convenience, each of the following embodiments will be described by being divided into a plurality of sections, etc. However, unless shown particularly explicitly, they are by no means independently separate from each other. Regardless of before and after the description, each part of a single example, one of which is a partial detail of the other or a modification or the like of some or all of the other. Further, as a general rule, a repeated description of like parts will be omitted. Respective components in the embodiments are not essential unless shown particularly explicitly, except for the case where the number of the components is limited theoretically and unless otherwise apparent from the context.

Similarly, when a material, composition or the like is taken up in the description of each embodiment or the like, the expression of "X comprising A" or the like does not exclude one including a component other than A unless shown particularly explicitly and unless exclusion of another component is obvious from the context. For example, if the expression concerns a component, it means "X including A as a main component", etc. It is needless to say that for example, a "silicon member" or the like is not limited to pure silicon, but also includes a member made of a multi-component alloy which contains SiGe alloy or another type of silicon as a main component and other additives or the like. Further, gold plating, a Cu layer, nickel plating, etc. include not only a pure member but also members including gold, Cu, nickel, etc. as main components respectively unless otherwise stated, particularly except as expressly stated.

Further, even when reference is made to a specific numerical value or quantity, it may be a numerical value exceeding the specific numerical value or a numerical value less than the specific numerical value unless shown particularly explicitly and theoretically limited to the specific numerical value, and unless otherwise expressly stated from the context.

In the respective drawings of the embodiments, the same or like parts are denoted by the same or like symbols or reference numerals, and their description will not repeated in principle.

Further, in the accompanying drawings, rather, when they become complex or distinction with voids is clear, there is a case where hatching or the like may be omitted even in sectional diagrams. In connection with this, if apparent from the description or the like, for example, the outline of the background may be omitted even in the case of a hole closed in a plane. Furthermore, even without a cross-section, hatching or dot patterns may be applied to clearly show non-voids or to clearly indicate the boundary of the region.

Embodiment 1

The present embodiment will be descried by taking as an example of a semiconductor device having a plurality of semiconductor components electrically coupled to each other through an interposer, an embodiment in which a plurality of wiring layers are formed in a silicon substrate, what is called, a plurality of semiconductor chips are mounted to a silicon interposer. Described specifically, a semiconductor device to be described by illustratively taking the same in the present embodiment has a memory chip formed with a memory circuit, and a logic chip formed with a control circuit for controlling the memory chip and an arithmetic processing circuit. Further, the memory chip and the logic chip are electrically coupled via the silicon interposer, and a system is formed within one package. Thus, a semiconductor device with the system formed within one package is called a SiP (System in Package). Further, a semiconductor device equipped with a plurality of semiconductor chips within one package is called an MCM (Multi Chip Module).

<Outline of Semiconductor Device>

Figure 2:
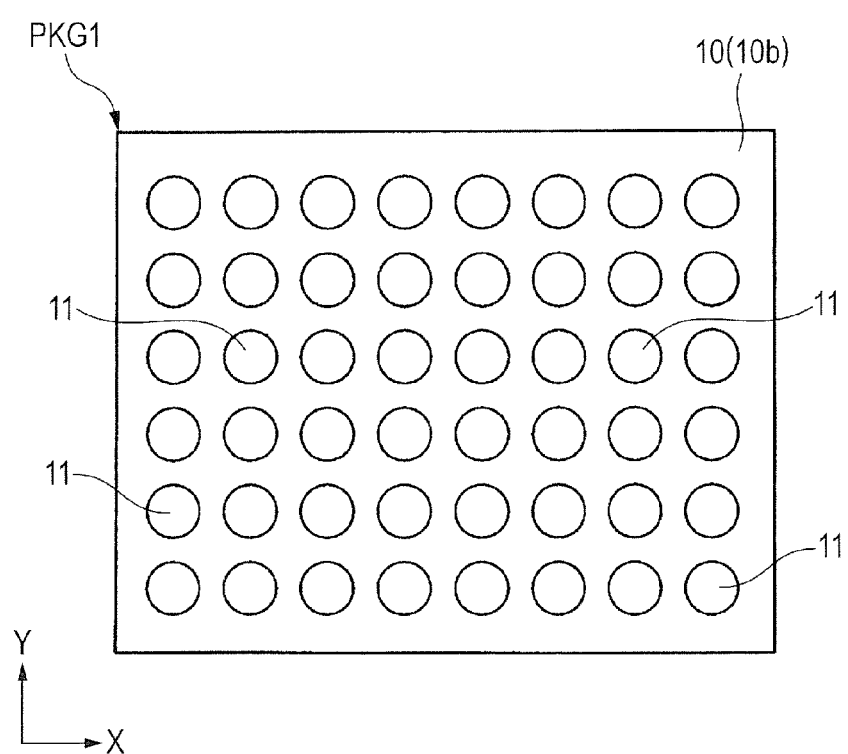
FIG. 2 is a bottom diagram of the semiconductor device shown in FIG. 1.
Figure 3:
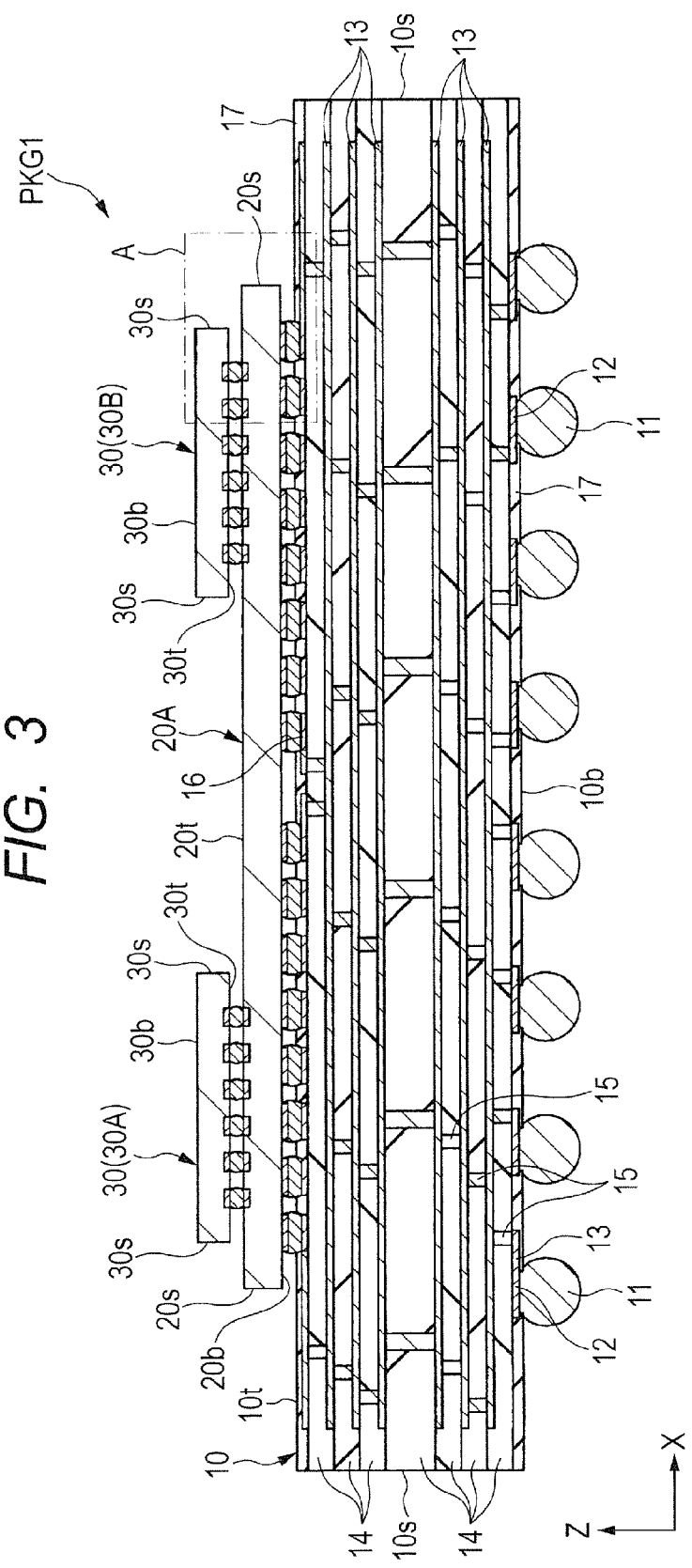
FIG. 3 is a sectional diagram taken along line A-A of FIG. 1.
Figure 4:
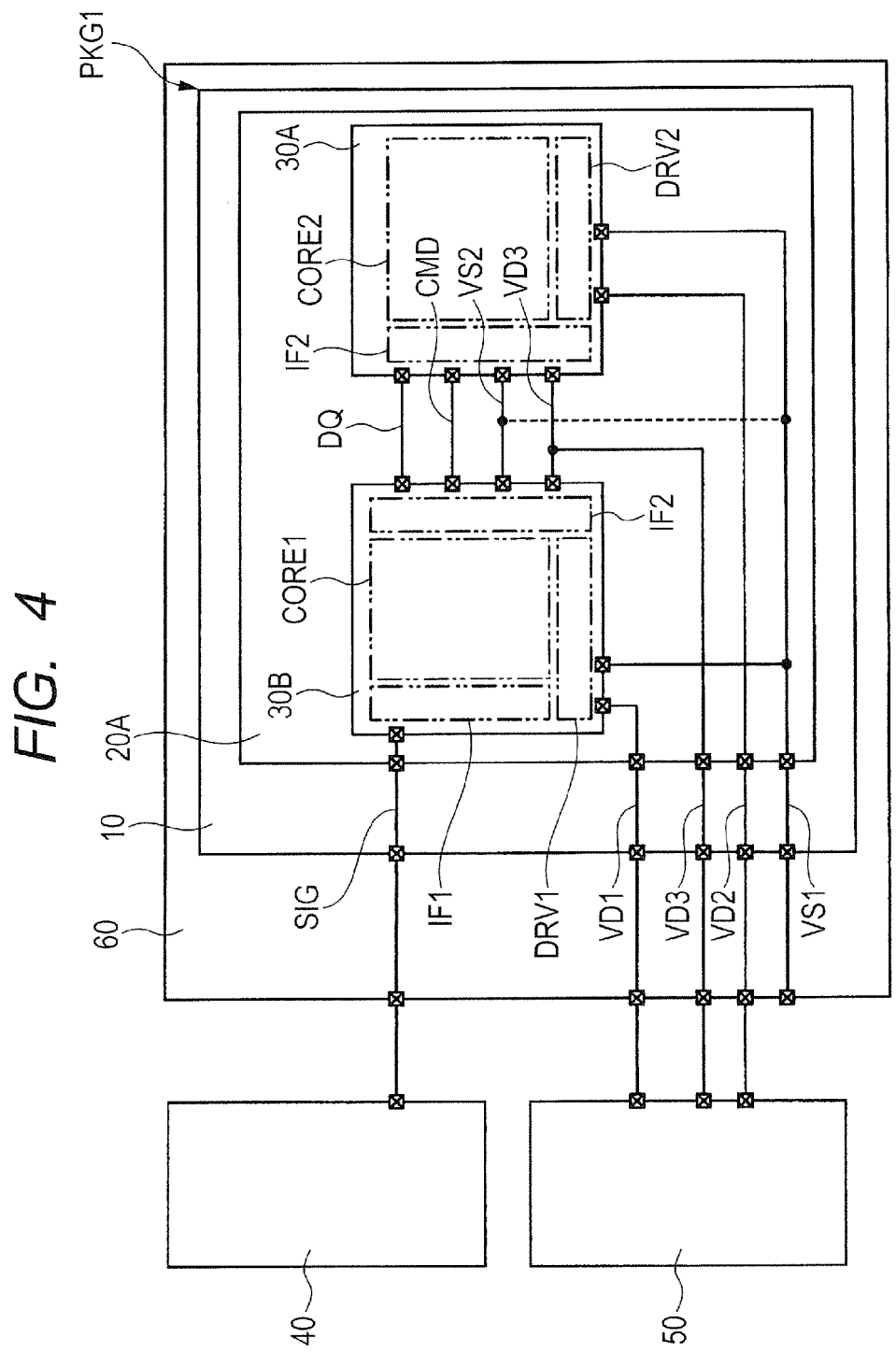
FIG. 4 is an explanatory diagram showing a circuit configuration example when the semiconductor device shown in FIGS. 1 to 3 is mounted onto a mounting substrate.

An outline of a structure of a semiconductor device according to the present embodiment will first be described using FIGS. 1 to 4. FIG. 1 is a top diagram of the semiconductor device according to the present embodiment, and FIG. 2 is a bottom diagram of the semiconductor device shown in FIG. 1. Further, FIG. 3 is a sectional diagram taken along line A-A of FIG. 1. Moreover, FIG. 4 is an explanatory diagram showing a circuit configuration example when the semiconductor device shown in FIGS. 1 to 3 is mounted over a mounting substrate.

Incidentally, there is shown in FIGS. 2 and 3, an embodiment where the number of terminals is reduced for easiness to see. As the number of terminals, however, there may be mentioned various modifications in addition to the embodiment shown in FIGS. 2 and 3. For example, the number of solder balls 11 shown in FIG. 2 may be increased more than the number shown in FIG. 2. Further, one of a plurality of wirings 13 formed in respective wiring layers is illustratively shown in FIG. 3 for easiness to see. Moreover, in the example shown in FIG. 4, typical transmission paths of a large number of transmission paths that the semiconductor device PKG1 has are illustratively shown.

As shown in FIGS. 1 and 3, the semiconductor device PKG1 according to the present embodiment has a wiring substrate (package substrate) 10, an interposer (relay substrate) 20A mounted over the wiring substrate 10, and a plurality of semiconductor chips 30 mounted over the interposer 20A. The semiconductor chips 30 are mounted over the interposer 20A side by side.

Further, as shown in FIG. 2, a plurality of solder balls (external terminals, electrodes, external electrodes) 11 corresponding to external terminals are arranged in matrix (array form, matrix form) over a lower surface 10b of the wiring substrate 10, which is a mounting surface of the semiconductor device PKG1. Each of the solder balls 11 is coupled to a land (external terminal, electrode, external electrode) 12 (refer to FIG. 3).

As in the semiconductor device PKG1, a semiconductor device in which a plurality of external terminals (solder balls 11, lands 12) are arranged on the mounting surface side in a matrix form is called an area array type semiconductor device. It is preferable in that since the area array type semiconductor device PKG1 can effectively utilize the mounting surface (lower surface 10b) side of the wiring substrate 10 as an arrangement space of the external terminals, an increase in the mounting area of the semiconductor device PKG1 can be suppressed even if the number of external terminals increases. That is, the semiconductor device PKG1 in which the number of external terminals increases with high functionalizing and high integration can be mounted with space saving.

Also, as shown in FIG. 3, the wiring substrate 10 has an upper surface (surface, chip mounting surface) 10t over which the semiconductor chips 30 are mounted via the interposer 20A interposed therebetween, a lower surface (surface, mounting surface) 10b located on the side opposite to the upper surface 10t, and side surfaces 10s arranged between the upper surface 10t and the lower surface 10b. Further, the wiring substrate 10 assumes a rectangular outer shape in plan view as shown in FIG. 1.

Further, as shown in FIG. 3, the interposer 20A has an upper surface (surface, chip mounting surface) 20t over which the semiconductor chips (semiconductor components) 30 are mounted, a lower surface (surface, mounting surface) 20b located on the side opposite to the upper surface 10t, and side surfaces 20s arranged between the upper surface 20t and the lower surface 20b. Further, the interposer 20A assumes a rectangular outer shape in plan view as shown in FIG. 1.

Furthermore, as shown in FIG. 3, each of the semiconductor chips 30 has a front surface (main surface, upper surface) 30t, a back surface (main surface, lower surface) 30b located on the side opposite to the front surface 30t, and side surfaces 30s located between the front surface 30t and the back surface 30b. In addition, each of the semiconductor chips 30 assumes a rectangular outer shape in plan view as shown in FIG. 1.

In the example shown in FIGS. 1 and 3, one of the semiconductor chips 30 is a memory chip 30A equipped with a memory circuit, and the other is a logic chip 30B equipped with a control circuit which controls the memory circuit. Further, in the example shown in FIGS. 1 and 3, the memory chip 30A and the logic chip 30B are respectively coupled directly to the interposer 20A. In other words, substrates and other chip components are not inserted between the memory chip 30A and the interposer 20A and between the logic chip 30B and the interposer 20A.

Also, as shown in FIG. 4, the semiconductor device PKG1 according to the present embodiment is equipped with a system operated by transmitting signals between the logic chip 30B and the memory chip 30A. The memory chip 30A has a main storage circuit (memory circuit) which stores data communicated with the logic chip 30B. Further, the logic chip 30B is equipped with a control circuit which controls the operation of the main storage circuit of the memory chip 30A. Moreover, the logic chip 30B is provided with an arithmetic processing circuit which performs arithmetic processing on a data signal inputted thereto. In FIG. 4, the main circuit such as the arithmetic processing circuit, the control circuit or the like is shown as a core circuit (main circuit) CORE1 as one example. Circuits included in the core circuit CORE1 may however include circuits other than the above. For example, an auxiliary storage circuit (memory circuit) smaller in storage capacity than the main storage circuit of the memory chip 30A, such as a cache memory or the like which primarily stores data therein, may be formed in the logic chip 30B.

Further, the logic chip 30B is formed with an external interface circuit (input/output circuit, external input/output circuit) IF1 which performs the input/output of signals from and to an external device 40. A signal line SIG which transmits each signal between the logic chip 30B and the external device 40 is coupled to the external interface circuit IF1. Moreover, the external interface circuit IF1 is coupled even to the core circuit CORE1, and the core circuit CORE1 is capable of transmitting each signal to the external device 40 through the external interface circuit IF1.

Furthermore, the logic chip 30B is formed with an internal interface circuit (input/output circuit, internal input/output circuit) IF2 which performs the input/output of signals from and to an internal device (e.g., memory chip 30A). A data line (signal line) DQ which transmits a data signal, and a control signal line (signal line) CMD which transmits data signals for control such as an address signal, a command signal, etc. are coupled to the internal interface circuit IF2. The data line DQ and the control signal line CMD are respectively coupled to the internal interface circuit IF2 of the memory chip 30A.

Still further, the logic chip 30B is equipped with a power supply circuit DRV1 which supplies potentials for driving the core circuit CORE1 and the input/output circuits. In the example shown in FIG. 4, a power line VD1 which supplies a power supply potential, and a reference potential line VS1 which supplies a reference potential are coupled to the power supply circuit DRV1. In the example shown in FIG. 4, the potentials for driving the core circuit CORE1 and the input/output circuits are supplied from a power supply 50 provided outside the semiconductor device PKG1 to each circuit via the power supply circuit DRV1.

Incidentally, while the example in which the pair of the power line VD1 and the reference potential line VS1 is coupled to the logic chip 30B is illustrated in FIG. 4, the potentials supplied to the logic chip 30B are not limited to the above two types. For example, the power supply circuit DRV1 may include an external interface power supply circuit which supplies a voltage for driving the external interface circuit IF1 of the logic chip 30B, and a core power supply circuit which supplies a voltage for driving the core circuit CORE1 of the logic chip 30B. Further, the power supply circuit DRV1 may include an internal interface power supply circuit which supplies a voltage for driving the internal interface circuit IF2 of the logic chip 30B. In this case, a plurality of power lines VD1 which supply a plurality of power supply potentials different from each other are coupled to the logic chip 30B.

Further, the potential supplied to the reference potential line VS1 shown in FIG. 4 is, for example, a ground potential. Since, however, the drive voltage is defined by the difference between a first potential and a second potential different from each other, the potential supplied to the reference potential line VS1 may be a potential other than the ground potential.

As in the logic chip 30B, one obtained by collectively forming circuits necessary for the operation of a certain device or a system in one semiconductor chip 30 is called a SoC (System on a Chip). If, however, the main storage circuit shown in FIG. 4 is formed in the logic chip 30B, the system can be configure by one sheet of logic chip 30B. However, the required capacity of the main storage circuit varies depending on the device or system caused to operate. Therefore, the versatility of the logic chip 30B can be improved by forming a main storage circuit in the semiconductor chip 30 (i.e., memory chip 30A) different from the logic chip 30B. Further, the degree of freedom in design for the capacity of the storage circuit included in the system is improved by coupling a plurality of sheets of memory chips 30A depending on the required storage capacity of the main storage circuit.

Also, in the example shown in FIG. 4, the memory chip 30A is equipped with a main storage circuit. In FIG. 4, the main storage circuit is illustrated as a core circuit (main circuit) CORE2 of the memory chip 30A. However, circuits other than the main storage circuit may be included in circuits included in the core circuit CORE2.

Further, the memory chip 30A is formed with an internal interface circuit (internal input/output circuit) IF2 which performs the input/output of signals from and to an internal device (e.g., logic chip 30B).

Furthermore, the memory chip 30A is equipped with a power supply circuit (drive circuit) DRV2 which supplies a potential for driving the core circuit CORE2. In the example shown in FIG. 4, a power line VD2 which supplies a power supply potential, and a reference potential line VS1 which supplies a reference potential are coupled to the power supply circuit DRV2. In the example shown in FIG. 4, a power supply potential supplied to the power line VD1, a power supply potential supplied to the power line VD2, and a power supply potential supplied to a power line VD3 are respectively supplied from the power supply 50 provided outside the semiconductor device PKG1.

Incidentally, FIG. 4 shows the example in which the pair of the power line VD2 and the reference potential line VS1 is coupled to the memory chip 30A. Further, in the example shown in FIG. 4, the logic chip 30B and the memory chip 30A are electrically coupled through the power line VD3 which supplies a power supply potential for driving the internal interface circuit IF2, and a reference potential line VS2 respectively. As a system for supplying each potential to the memory chip 30A, however, there may be mentioned various modifications other than the above. For example, the power supply potential for driving the internal interface circuit IF2 of the logic chip 30B, and the power supply potential for driving the internal interface circuit IF2 of the memory chip 30A may respectively be supplied independently.

Also, in the example shown in FIG. 4, the reference potential line VS2 is included in a plurality of transmission paths electrically coupling the logic chip 30B and the memory chip 30A in addition to the data line DQ and the control signal line CMD. The reference potential line VS2 serves as, for example, a path (return current path) which transmits a reference signal for a data signal transmitted by the data line DQ. For example, a ground potential is supplied to the reference potential line VS2 as a reference potential. When the ground potential is supplied to the reference potential line VS2 and the reference potential line VS1 respectively, the reference potential line VS2 and the reference potential line VS1 may preferably be coupled to stabilize the potential. Thus, it is preferable that as shown in FIG. 4 with a dotted line attached thereto, the reference potential line VS2 and the reference potential line VS1 are coupled to each other in the interposer 20A. However, the reference potential line VS2 for reference may be supplied with potentials other than the ground potential if a fluctuation in potential in the transmission path can be reduced. For example, a power supply potential for an input/output power supply circuit may be used as a reference potential for reference.

Further, in the example shown in FIG. 4, the power line VD2 which supplies the power supply potential to the memory chip 30A, and the reference potential line VS1 which supplies the reference potential to the memory chip 30A are respectively coupled to the memory chip 30A without via the logic chip 30B. As a modification relative to FIG. 4, the power line VD1 and the reference potential line VS2 may be coupled to the memory chip 30A via the logic chip 30B.

<Configuration of Each Component>

Figure 5:
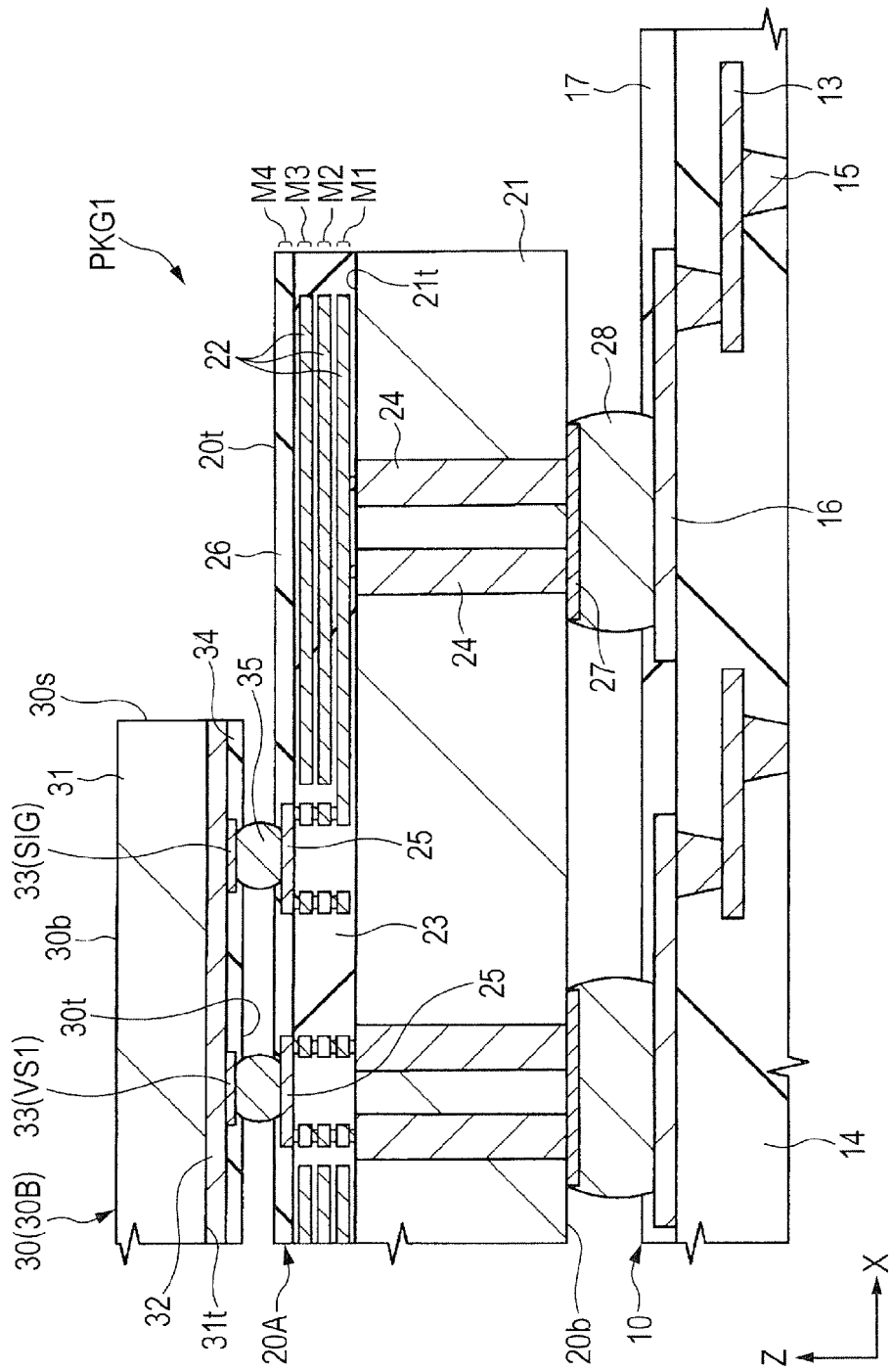
FIG. 5 is an enlarged sectional diagram of a portion A in FIG. 3.
Figure 6:
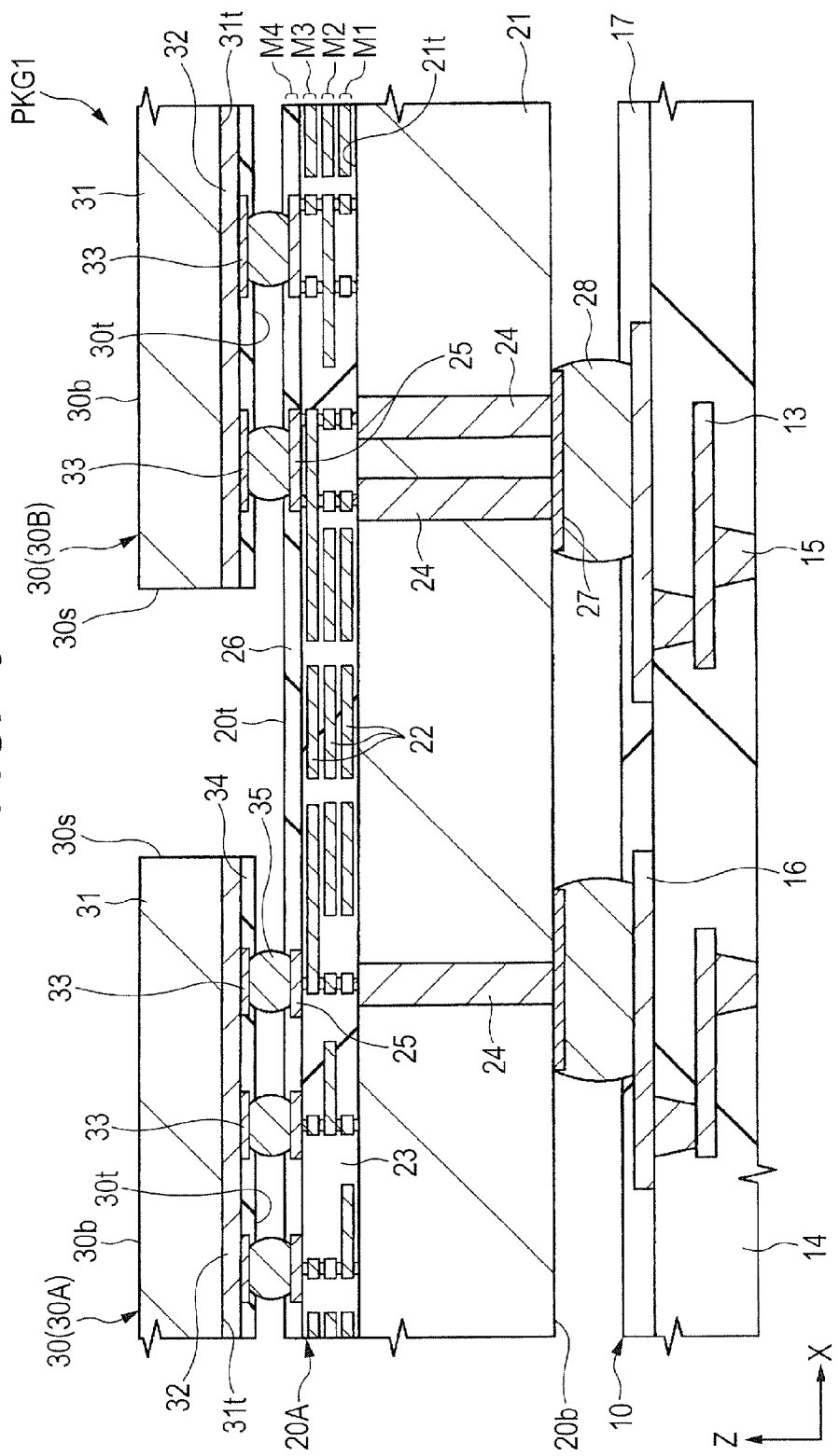
FIG. 6 is an enlarged sectional diagram of the periphery of an area between adjacent semiconductor chips, which is shown in FIG. 3.

Main components which configure the semiconductor device PKG1 shown in FIGS. 1 to 4 will next be described in order. FIG. 5 is an enlarged sectional diagram of a portion A in FIG. 3. Further, FIG. 6 is an enlarged sectional diagram of the periphery of an area between the adjacent semiconductor chips, which is shown in FIG. 3.

The wiring substrate 10 shown in FIGS. 1 to 5 is a substrate equipped with transmission paths for supplying electric signals and potentials between the semiconductor device PKG1 and a mounting substrate 60 (refer to FIG. 4). The wiring substrate 10 has a plurality of wiring layers (eight layers in the example shown in FIG. 3) which electrically couple the upper surface 10t side and the lower surface 10b side. A plurality of wirings 13 provided in the respective wiring layers are covered with an insulating layer 14 for insulating between the wirings 13 and between the adjacent wiring layers.

The wiring substrate 10 shown in FIG. 3 has a plurality of insulating layers 14 laminated on each other. The middle insulating layer 14 is, for example, a core layer (core material) in which a resin material such as an epoxy resin or the like is impregnated in a fiber material such as a glass fiber or the like. Further, the insulating layers 14 respectively formed at the upper and lower surfaces of the core layer are formed by, for example, a build-up method. As a modification relative to FIG. 3, however, a so-called coreless substrate having no insulating layer 14 as the core layer may be used.

Further, the wiring substrate 10 has via wirings 15 which are provided between the respective wiring layers and are interlayer conductive paths which couple the laminated wiring layers in a thickness direction. Further, a plurality of bonding pads (terminals, chip mounting surface side terminals, electrodes) 16 are formed in the upper surface 10t of the wiring substrate 10. Incidentally, the wirings 13 provided at the uppermost wiring layer (wiring layer on the top surface 10t side) of the wiring layers included in the wiring substrate 10 are respectively formed integrally with the bonding pads 16. In other words, each bonding pad 16 can be considered to be part of the wiring 13. Further, when the bonding pad 16 and the wiring 13 are considered in distinction from each other, a portion exposed from an insulating film 17, and a portion covered with the insulating film 17 can respectively be defined as the bonding pad 16 and the wiring 13 at the upper surface 10t of the wiring substrate 10.

On the other hand, a plurality of lands (terminals, solder coupling pads) 12 are formed at the lower surface 10b of the wiring substrate 10. The solder balls 11 are respectively coupled to the lands 12. The mounting substrate 60 and the semiconductor device PKG1 both shown in FIG. 4 are electrically coupled via the solder balls 11 shown in FIG. 3. That is, the solder balls 11 respectively function as external coupling terminals of the semiconductor device PKG1.

These solder balls 11 and lands 12 are respectively electrically coupled to the bonding pads 16 on the upper surface 10t side through the wirings 13 of the wiring substrate 10. Incidentally, the wirings 13 provided at the lowermost wiring layer (wiring layer on the bottom surface 10b side) of the wiring layers included in the wiring substrate 10 are respectively formed integrally with the lands 12. In other words, each of the lands 12 can be considered to be part of the wiring 13. Further, when the land 12 and the wiring 13 are considered in distinction from each other, a portion exposed from an insulating film 17, and a portion covered with the insulating film 17 can respectively be defined as the land 12 and the wiring 13 at the lower surface 10b of the wiring substrate 10.

Also, as a modification relative to FIG. 3, there is also a case where each of the lands 12 itself is caused to function as an external coupling terminal. In this case, the solder balls 11 are not coupled to the lands 12, and each of the lands 12 is exposed from the insulating film 17 at the lower surface 10b of the wiring substrate 10. Further, as another modification relative to FIG. 3, there is also a case where a thin solder film is coupled in place of the ball-shaped solder balls 11 and caused to function as an external coupling terminal. Alternatively, there is also a case where for example, a golden (Au) film formed by a plating method is formed at an exposed surface and used as an external coupling terminal. Further, the external coupling terminal may also be formed in a pin shape (rod shape).

Further, the upper surface 10t and the lower surface 10b of the wiring substrate 10 are covered with the insulating films (solder resist films) 17. The wirings 13 formed in the upper surface 10t of the wiring substrate 10 are covered with the insulating film 17. Openings are formed in the insulating film 17. At least some (bonding regions) of the bonding pads 16 are exposed from the insulating film 17 at the openings. Further, the wirings 13 formed in the lower surface 10b of the wiring substrate 10 are covered with the insulating film 17. Openings are formed in the insulating film 17, and at least some (junction portions with the solder balls 11) of the lands 12 are exposed from the insulating film 17 at the openings.

Moreover, as shown in FIG. 5, the semiconductor device PKG1 is equipped with the interposer 20A mounted over the wiring substrate 10. The interposer 20A is a relay substrate interposed between the wiring substrate 10 and the semiconductor chips 30. In the present embodiment, the interposer 20A has a silicon substrate (basic material) 21 having a main surface 21t, and a plurality of wiring layers M1, M2, and M3 arranged over the main surface 21t. Assuming that layers formed with a plurality of surface electrodes 25 are taken to be a wiring layer M4 as shown in FIG. 5, four wiring layers are laminated on each other in the example shown in FIG. 5. The wiring layers M1, M2, and M3 are respectively formed with a plurality of wirings (conductor patterns) 22. The wirings 22 are covered with an insulating layer 23 which insulates between the wirings 22 and between the adjacent wiring layers. The insulating layer 23 is an inorganic insulating layer comprised of, for example, an oxide of a semiconductor material such as silicon oxide (SiO).

Still further, a plurality of surface electrodes (electrode pads, terminals) 25 are formed over the wiring layer M3 of the interposer 20A. Part of each of the surface electrodes 25 is exposed from a passivation film 26 corresponding to a protective insulating film at the upper surface 20t of the interposer 20A. Then, the surface electrode 25 is electrically coupled to an electrode (surface electrode, pad) 33 of the semiconductor chip 30 through a bump electrode 35 coupled to the exposed portion of the surface electrode 25.

Still further, a plurality of back surface electrodes (electrodes, pads, terminals) 27 are formed over the lower surface 20b of the interposer 20A. The back surface electrodes 27 are exposed at the lower surface 20b of the interposer 20A, which is located on the opposite side of the main surface 21t of the silicon substrate 21. Then, the back surface electrodes 27 are respectively electrically coupled to the bonding pads 16 of the wiring substrate 10 through bump electrodes 28 coupled to the back surface electrodes 27.

Still further, the interposer 20A is equipped with a plurality of through electrodes 24 which penetrate the silicon substrate 21 in its thickness direction (direction toward from one of the main surface 21t and the lower surface 20b to other). Each of the through electrodes 24 is a conductive path formed by embedding, for example, a conductor such as copper (Cu) in a through hole formed so as to penetrate the silicon substrate 21 in its thickness direction. Each of the through electrodes 24 has one end coupled to the back surface electrode 27, and the other end coupled to the wiring 22 of the wiring layer M1. That is, the surface electrodes 25 of the interposer 20A and the back surface electrodes 27 thereof are respectively electrically coupled via the wirings 22 and the through electrodes 24.

Meanwhile, the wiring width of a wiring pattern is set to a certain degree of dimension defined by an aspect ratio with a wiring thickness. For example, when the thickness of a metal film configuring a wiring pattern is thick, the width of the wiring pattern can be made narrow only within a range corresponding to the thickness of the metal film. In the present embodiment, the thickness of each of the wirings 22 formed in the interposer 20A is thinner than the thickness of each of the wirings 13 formed in the wiring substrate 10. Therefore, the wirings 22 formed in the interposer 20A can be improved in wiring density as compared with the wirings 13 of the wiring substrate 10.

In particular, the interposer 20A of the present embodiment has, as shown in FIG. 5, the silicon substrate (basic material) 21 and has a structure in which the wiring layers M1, M2, and M3 are laminated over the main surface 21t of the silicon substrate 21. Thus, when the wirings 22 are formed over the semiconductor substrate, the wiring density can be improved by using a process similar to a process of forming wirings in a semiconductor wafer.

When the process of forming the wirings in the semiconductor wafer is used, the thickness of each wiring layer and the distance between the wiring layers are also decreased. For example, the thickness of each of the wiring layers M1, M2, and M3 shown in FIGS. 5 and 6, i.e., the thickness of each of the wirings 22 is thinner than the thickness of each wiring 13 of the wiring substrate 10. In FIGS. 5 and 6, the thickness of the wiring 13 becomes twice or less the thickness of the wiring 22 to describe the wiring 13 of the wiring substrate 10 and the wiring 22 of the interposer 20A in one drawing. However, the thickness of each wiring 13 is about several times to several tens of times of the value of the above-described thickness of the wiring 22.

Further, the separation distances between the wiring layers M1, M2, and M3, and the distance of separation between the main surface 21t of the silicon substrate 21 and the wiring layer M1 are smaller than the thickness of the wiring 22. The separation distances between the wiring layers M1, M2, and M3, and the distance of separation between the main surface 21t of the silicon substrate 21 and the wiring layer M1 is about half of the thickness of each of the wirings 22 formed in the wiring layers M1, M2, and M3. Incidentally, the distance of separation between the uppermost wiring layer M4 formed with the surface electrodes 25 and the wiring layer M3 is larger than the separation distances between the wiring layers M1, M2, and M3. For example, the distance of separation between the wiring layer M4 and the wiring layer M3 is the same degree as the thickness of the wiring 22.

Thus, since the interposer 20A can be improved in wiring density as compared with the wiring substrate 10, the interposer 20A is particularly effective where the number of signal transmission paths which couple between the semiconductor chips 30 is increased. In particular, as in the example shown in FIG. 4 of the present embodiment, the number of the wirings 13 (refer to FIG. 3) formed in the wiring substrate 10 can be reduced by providing the interposer 20A where increasing the number of signal transmission paths which couple between the logic chip 30B and the memory chip 30A.

Incidentally, in the present embodiment, the silicon substrate 21 widely used in the manufacturing process of the semiconductor wafer is used as a basic material. Therefore, the silicon substrate 21 shown in FIG. 5 is formed with silicon being a semiconductor material as a base material (main component). Further, it is common practice for the semiconductor substrate used in the manufacture of the semiconductor chip that an impurity element which forms a p-type or n-type conductive characteristic is doped in the semiconductor material as the base material. Therefore, when the semiconductor wafer used for general purpose is used as the silicon substrate 21, the impurity element that configures the p-type or n-type conductive characteristic is included in the silicon substrate 21.

Various modifications are however applicable to the silicon substrate 21 of the present embodiment. For example, as the semiconductor substrate, a semiconductor material other than silicon may be used as a base material. Further, a semiconductor in which an impurity element is undoped in a semiconductor material can also be used as a semiconductor substrate.

Further, as shown in FIG. 6, the semiconductor device PKG1 is equipped with a plurality of semiconductor chips 30 mounted over the upper surface 20t of the interposer 20A. Each of the semiconductor chips 30 has a silicon substrate (basic material) 31 having a main surface 31t, and a wiring layer 32 disposed over the main surface 31t. Incidentally, although one wiring layer 32 is illustrated in FIGS. 5 and 6 for easiness to see, for example, a plurality of wiring layers thinner in thickness than the wiring layers M1, M2, and M3 of the interposer 20A are laminated as the wiring layers 32 shown in FIGS. 5 and 6. Further, though illustration is omitted for easiness to see, each of the wiring layers 32 is formed with a plurality of wirings. Further, the wirings are covered with an insulating layer which insulates between the wirings and between the adjacent wiring layers. The insulating layer is an inorganic insulating layer comprised of, for example, an oxide of a semiconductor material such as silicon oxide (SiO).

Furthermore, a plurality of semiconductor elements such as transistor elements or diode elements, etc. are formed over the main surface 31t of the silicon substrate 31 that each of the semiconductor chips 30 has. The semiconductor elements are respectively electrically coupled to a plurality of electrodes 33 formed on the surface 30t side through the wirings of the wiring layers 32.

Still further, in the present embodiment, each of the semiconductor chips 30 is mounted over the upper surface 20t of the interposer 20A in a state in which the surface 30t and the upper surface 20t of the interposer 20A are opposed to each other. Such a mounting system is called a face-down mounting system or a flip-chip connection system. In the flip-chip connection system, each semiconductor chip 30 and the interposer 20A are electrically coupled as follows.

A plurality of electrodes (surface electrodes, pads, terminals) 33 are formed over the wiring layer 32 of each semiconductor chip 30. Part of each of the electrodes 33 is exposed from a passivation film 34 corresponding to a protective insulating film at the surface 30t of the semiconductor chip 30. Then, each of the electrodes 33 is electrically coupled to the surface electrode 25 of the interposer 20A through the bump electrode 35 coupled to an exposed portion of the electrode 33.

Further, in the present embodiment, as shown in FIG. 4, some of the transmission paths coupled to the memory chip 30A are not coupled to the wiring substrate 10 and are coupled to the logic chip 30B through the interposer 20A. In the example shown in FIG. 4, the data line DQ and the control signal line CMD are electrically isolated from the wiring substrate 10. On the other hand, of the transmission paths coupled to the memory chip 30A, the power line VD2 which supplies the power supply potential for driving each circuit in the memory chip 30A, and the reference potential line VS1 are electrically coupled to the wiring substrate 10. Incidentally, the reference potential line VS2 used for the reference of the signal line, of the transmission paths which electrically couple the logic chip 30B and the memory chip 30A, may be separated from the wiring substrate 10.

<Details of Wiring Structure of Interposer>

A description will next be made about the details of the signal transmission paths which electrically couple the logic chip 30B and the memory chip 30A as shown in FIG. 4.

As a typical example of the SiP type semiconductor device, there may be mentioned, as in the present embodiment, the configuration that the logic chip 30B and the memory chip 30A are mounted within one package. In order to improve the performance of the SiP type semiconductor device of such a configuration, the technique of improving the transmission rates of the signal transmission paths which couple the logic chip 30B and the memory chip 30A is required. For example, of the signal transmission paths shown in FIG. 4, each of a plurality of data lines DQ is designed in such a manner as to transmit a data signal at a transmission rate of 1 Gbps (1 gigabit per second) or over. In order to increase the transmission rate of each of the signal transmission paths, there is a need to increase the number of times of transmission per unit time (hereinafter described as high clocking).

Further, as another method of improving the signal transmission rate between the logic chip 30B and the memory chip 30A, there is known a method for making large the width of a data bus of an internal interface to increase the amount of data transmitted at a time (hereinafter described as bus width expansion). Furthermore, there is a method of applying the above-described bus width expansion and high clocking in combination with each other. In this case, a large number of high-speed signal transmission paths are required. Thus, as in the present embodiment, the method of electrically coupling the logic chip 30B and the memory chip 30A through the interposer 20A is effective which is capable of realizing a wiring density higher than that at the wiring substrate 10.

For example, the memory chip 30A shown in FIG. 4 is a so-called wide I/O memory that has a width of a data bus of 512 bits or more. Described in detail, the memory chip 30A is equipped with, for example, four channels each corresponding to a channel in which the width of a data bus is 128 bits. Calculating a total of bus widths for the four channels results in 512 bits. Further, the number of times of transmission per unit time of each channel is brought to high clocking and hence results in, for example, 1 Gbps or over for each channel.

It has however been found that when the logic chip 30B and the memory chip 30A are electrically coupled to each other through the large number of signal wirings formed in the relay substrate high in wiring density, there are problems from the viewpoint of reliability of signal transmission.

First, when the number of the transmission paths is increased using the interposer, the width of each of the wirings formed in the interposer becomes narrow and its thickness becomes thin. For example, the thickness of the wiring 22 shown in FIG. 6 is about 1 μm to 1.2 μm, and the separation distances between the wiring layers M1, M2, and M3 that the interposer has are about half of the thickness of the wiring 22.

Thus, when the width and thickness of each of the wirings 22 included in the relay substrate become small, the width and thickness of the wiring configuring the return current path of the signal current, in other words, the wiring supplied with the reference potential for reference also become small. In this case, there is a concern that the value of the reference potential for reference becomes instable.

For example, when the adjacent signal transmission paths utilize reference potentials respectively different in value as references, a reference potential line is affected by a current flowing through each signal transmission path. In this case, the reference potential line does not serve as the ideal return current path. Reversely, there is a concern that the reference potential line functions as a noise propagation path.

Thus, although the width and thickness of each of the wirings 22 become small where the wiring density is improved, it is necessary to stabilize the value of the reference potential for reference.

Therefore, the inventors of the present application have examined a technique for stabilizing the potential of each reference potential line formed in the interposer as part of measurements for improving the reliability of signal transmission and have found the configuration of the present embodiment.

That is, in the present embodiment, the value of the reference potential is stabilized by electrically coupling the reference potential wirings formed along the signal wirings at plural points. A description will be made below about its details using the drawings.

Figure 7:
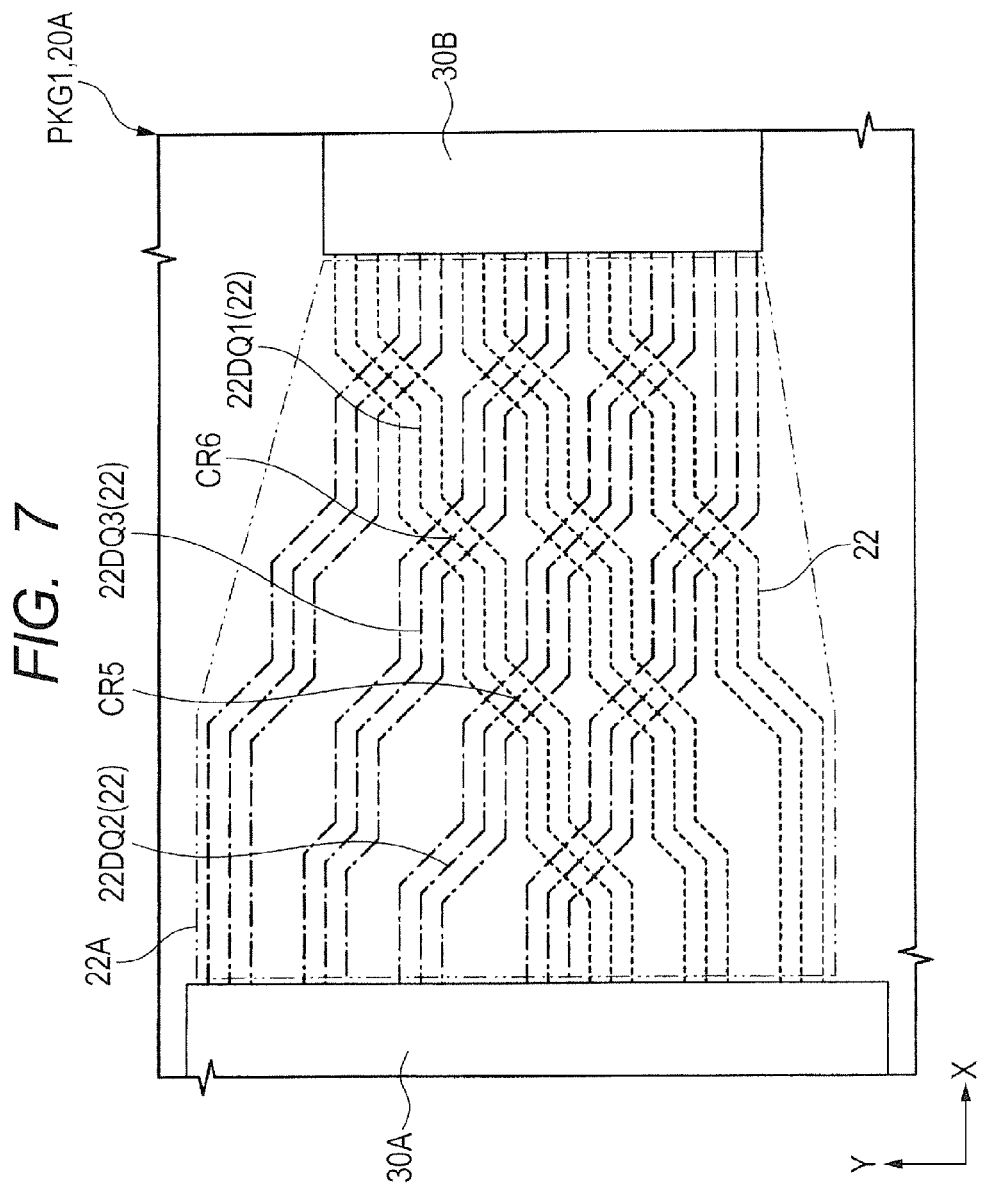
FIG. 7 is a plan diagram of a portion B in FIG. 1.
Figure 8:
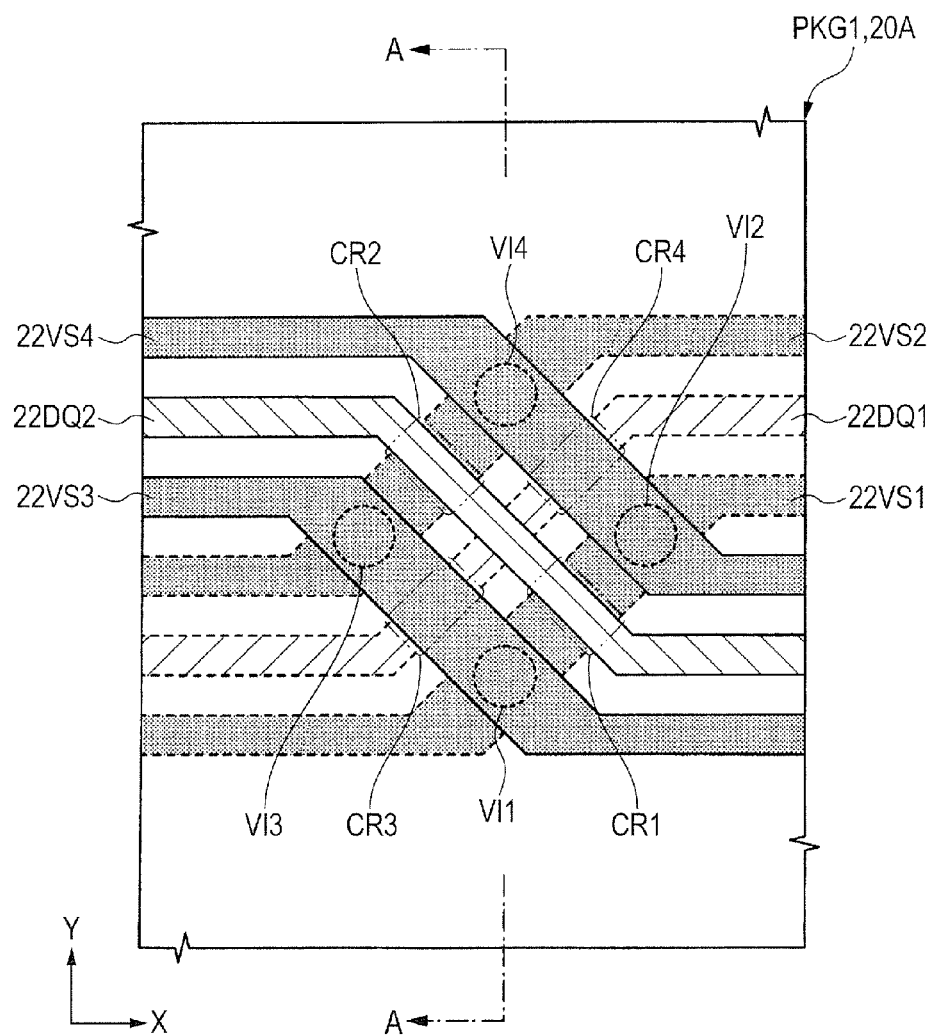
FIG. 8 is an enlarged plan diagram showing in a further enlarged form, part of an area in which a plurality of wirings shown in FIG. 7 are formed.

FIG. 7 is a plan diagram of a portion B in FIG. 1. Also, FIG. 8 is an enlarged plan diagram showing in a further enlarged form, part of an area in which a plurality of wirings shown in FIG. 7 are formed. Further, FIG. 9 is an enlarged sectional diagram taken along line A-A of FIG. 8.

Figure 9:
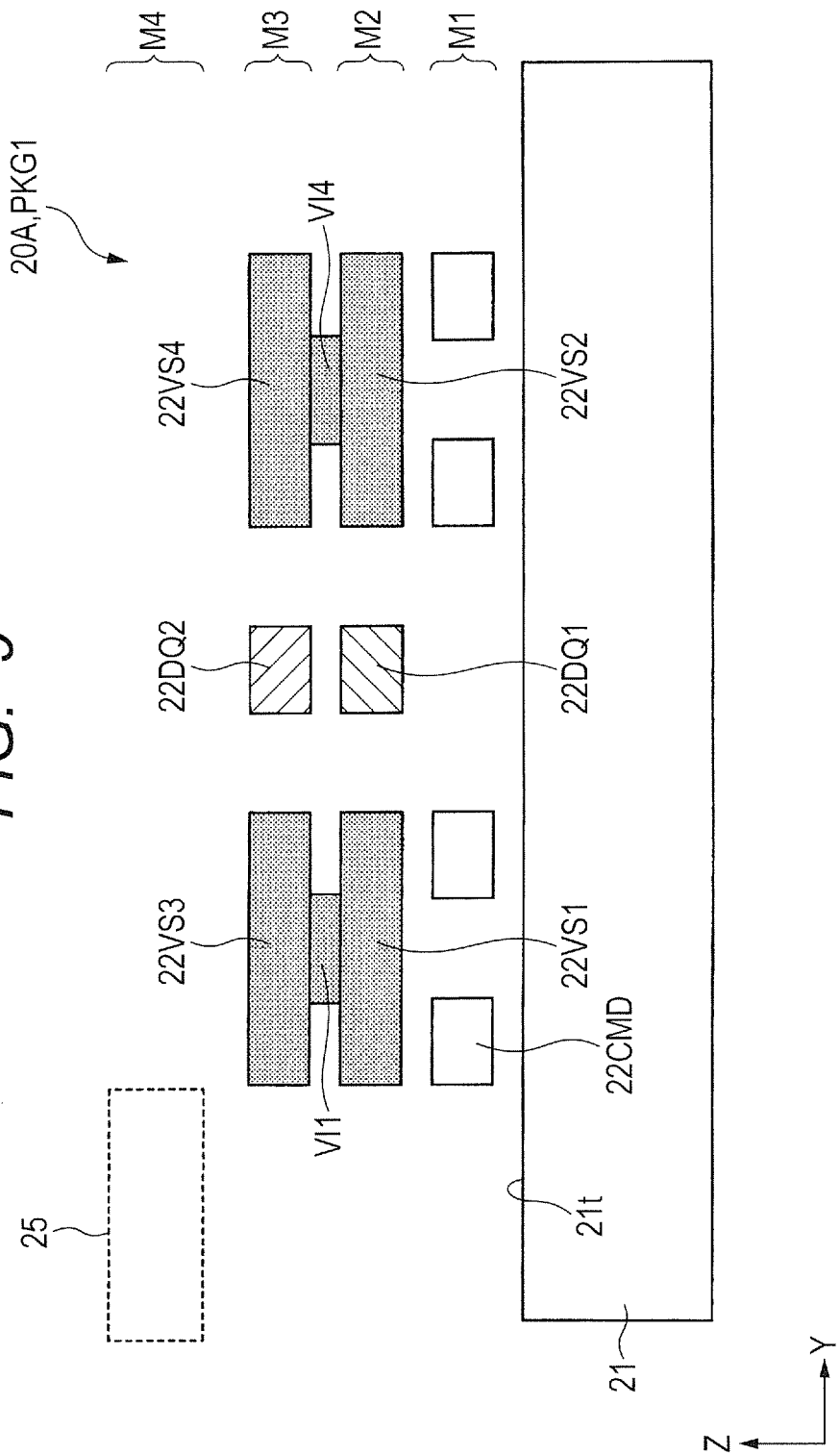
FIG. 9 is an enlarged sectional diagram taken along line A-A of FIG. 8.

Incidentally, in FIG. 7, each wiring of the wiring layer M3 shown in FIG. 9 is shown by a dashed line and each wiring of the wiring layer M2 is shown by a dotted line to show a layout example of the wirings which electrically couple the memory chip 30A and the logic chip 30B. Further, there is typically shown in FIG. 7, an image of a wiring layout. Therefore, as the number of the wirings 22, the number of bent portions, etc. there are mentioned various modifications in addition to the embodiment shown in FIG. 7. Further, in FIG. 7, the range of an area 22A interposed between the memory chip 30A and the logic chip 30B disposed side by side is shown by a two-dot chain line.

Also, in FIG. 8, each wiring for signal transmission and each wiring for the reference potential are shown attached with patterns different from each other in order to make it easy to identify them. Further, in FIG. 8, each wiring formed in the wiring layer M3 shown in FIG. 9 is shown by a solid line, and each wiring formed in the wiring layer M2 shown in FIG. 9 is shown by a dotted line in order to show a plane positional relationship between the wirings formed in the different wiring layers.

Furthermore, FIG. 9 is a sectional diagram, but is attached with different patterns according to the type of transmission target in order to identify the type of transmission paths configured by the wirings 22. Besides, in FIG. 9, the surface electrode 25 is shown by a dotted line to demonstrate that the wiring layer M4 is a layer for forming the surface electrode 25.

As shown in FIG. 7, of the wirings 22 formed in the interposer 20A, the wirings 22 which electrically couple the memory chip 30A and the logic chip 30B are mainly formed in the area 22A interposed between the memory chip 30A and the logic chip 30B. The area 22A is an area in which the memory chip 30A and the logic chip 30B are coupled in the shortest distance in plan view. Thus, the transmission path distance between the semiconductor chips can be shortened by electrically coupling the memory chip 30A and the logic chip 30B through the wirings 22 provided in the area 22A. Although the wiring structure of the interposer 20A will be described below, it is a description of the wiring structure in the area 22A interposed between the memory chip 30A and the logic chip 30B particularly except for where it is demonstrated that it is a description related to the wirings provided at other than the area 22A.

Further, as shown in FIG. 9, the wiring layer M2 that the interposer 20A of the present embodiment has is provided with a signal wiring (data signal wiring) 22DQ1. Further, the wiring layer M3 is provided with a signal wiring 22DQ2. A reference potential wiring 22VS1 and a reference potential wiring 22VS2 are provided on both neighboring sides of the signal wiring 22DQ1. Also, a reference potential wiring 22VS3 and a reference potential wiring 22VS4 are provided on both neighboring sides of the signal wiring 22DQ2. Further, as shown in FIG. 8, the signal wiring 22DQ1 and the signal wiring 22DQ2 cross each other in plan view, and the reference potential wirings 22VS1 and 22VS2 of the wiring layer M2 and the reference potential wirings 22VS3 and 22VS4 of the wiring layer M3 are coupled to each other at the periphery of their crossing portion.

The wiring structure shown in FIGS. 8 and 9 can be represented in more details as follows: As shown in FIG. 9, the interposer 20A has a plurality of wiring layers M1, M2, and M3 including a wiring layer M2 and a wiring layer M3 laminated over the wiring layer M2. Further, the wiring layer M2 has a reference potential wiring 22VS1 which extends from one of the memory chip 30A (refer to FIG. 7) and the logic chip 30B (refer to FIG. 7) to the other thereof, and a reference potential wiring 22VS2 which extends along the reference potential wiring 22VS1 Moreover, the wiring layer M2 has a signal wiring 22DQ1 which extends along the reference potential wiring 22VS1 and the reference potential wiring 22VS2 between the reference potential wiring 22VS1 and the reference potential wiring 22VS2.

Also, the wiring layer M3 has a reference potential wiring 22VS3 which extends from one of the memory chip 30A and the logic chip 30B to the other thereof, and a reference potential wiring 22VS4 which extends along the reference potential wiring 22VS3. Further, the wiring layer M3 has a signal wiring 22DQ2 which is electrically isolated from the signal wiring 22DQ1 and extends along the reference potential wiring 22VS3 and the reference potential wiring 22VS4 between the reference potential wiring 22VS3 and the reference potential wiring 22VS4.

Further, the reference potential wiring 22VS1 is coupled to the reference potential wiring 22VS3 through a via wiring (coupling portion) VI1 and coupled to the reference potential wiring 22VS4 through a via wiring (coupling portion) VI2. Moreover, as shown in FIG. 8, the reference potential wiring 22VS1 has a crossing portion CR1 which intersects with the signal wiring 22DQ2 between the via wiring VI1 and the via wiring VI2 in plan view.

Furthermore, the reference potential wiring 22VS2 is coupled to the reference potential wiring 22VS3 through a via wiring (coupling portion) VI3 and coupled to the reference potential wiring 22VS4 through a via wiring (coupling portion) VI4. Moreover, as shown in FIG. 8, the reference potential wiring 22VS2 has a crossing portion CR2 which intersects with the signal wiring 22DQ2 between the via wiring VI3 and the via wiring VI4 in plan view.

Still further, the relationship of coupling between the via wirings VI1, VI2, VI3, and VI4 and the reference potential wirings 22VS1, 22VS2, 22VS3, and 22VS4 can be represented as follows:

The reference potential wiring 22VS3 is coupled to the reference potential wiring 22VS1 through the via wiring VI1 and coupled to the reference potential wiring 22VS2 through the via wiring VI3. Moreover, as shown in FIG. 8, the reference potential wiring 22VS3 has a crossing portion CR3 which intersects with the signal wiring 22DQ1 between the via wiring VI1 and the via wiring VI3 in plan view.

Further, the reference potential wiring 22VS4 is coupled to the reference potential wiring 22VS1 through the via wiring VI2 and coupled to the reference potential wiring 22VS2 through the via wiring VI4. Moreover, as shown in FIG. 8, the reference potential wiring 22VS4 has a crossing portion CR4 which intersects with the signal wiring 22DQ1 between the via wiring VI2 and the via wiring VI4 in plan view.

As in the present embodiment, when each wiring for reference potential supply, which configures the return current path of the signal, is provided along the signal wiring, the number of wiring layers can be reduced as compared with the case where the reference potential is supplied to each sheet-like conductor pattern called a so-called ground plane.

Also, as in the present embodiment, the value of the reference potential for reference can be stabilized by coupling the reference potential wirings 22VS1, 22VS2, 22VS3, and 22VS4 extending along the signal wirings to one another. Further, with the stabilization of the value of the reference potential for reference, the potential of each reference potential wiring is hardly affected by the signal current. It is therefore possible to shield electromagnetic waves generated by the flow of current through each signal wiring.

Further, in the present embodiment, the signal wirings include the signal wirings (control signal wirings) 22CMD (refer to FIG. 9) through which signals are transmitted in a first frequency band, and the signal wirings 22DQ1 and 22DQ2 through which signals are transmitted in a second frequency band higher than the first frequency band. For example, in the example shown in FIG. 4, the data signals for control such as the address signal, the command signal, etc. transmitted by the control signal line CMD are transmitted at a frequency less than or equal to a half of the frequency of the data signal transmitted by the data line DQ. Thus, when the frequency bands used by the signal transmission paths differ, it is preferable to take preferential measures to the signal wirings 22DQ1 and 22DQ2 on which signal transmission is performed in a relatively high frequency band.

Furthermore, as shown in FIG. 7, each of the wirings 22 which electrically couple the memory chip 30A and the logic chip 30B, has an extension portion extending in an X direction and an inclination portion inclined with respect to the X direction, both of which are directed from one of the memory chip 30A and the logic chip 30B to the other thereof. As shown in FIG. 8, the via wirings VI1, VI2, VI3, and VI4 are respectively coupled to the inclination portions inclined with respect to the X direction, of the reference potential wirings 22VS1, 22VS2, 22VS3, and 22VS4.

Thus, the via wirings VI1, VI2, VI3, and VI4 are respectively coupled to the inclination portions inclined with respect to the X direction, of all the paths for the reference potential wirings 22VS1, 22VS2, 22VS3, and 22VS4 to make it possible to thicken the wiring widths of the reference potential wirings 22VS1, 22VS2, 22VS3, and 22VS4 at the portions to couple the via wirings VI1, VI2, VI3, and VI4 more than the extension portions. Since the wirings are arranged so as to adjoin each other along a Y direction crossing the X direction as shown in FIG. 8, the wiring density can be improved if the wiring width of each portion extending along the X direction is made thin even if the wiring widths of the portions to couple the via wirings VI1, VI2, VI3, and VI4 are increased. Further, since the cross sectional areas of the paths which electrically couple the reference potential wirings 22VS1, 22VS2, 22VS3, and 22VS4 to each other become large by making thick the wiring widths of the portions to couple the via wirings VI1, VI2, VI3, and VI4 to each other, the reference potential can be made easy to be stabilized.

Further, as shown in FIG. 9, in the present embodiment, the signal wirings 22CMD through which signals are transmitted in a frequency band lower in frequency than that for the data signal are included in the wirings formed in the interposer 20A. Since a low frequency signal is transmitted through each of the signal wirings 22CMD, the signal wiring 22CMD is hardly affected by noise as compared with the signal wirings 22DQ1 and 22DQ2. When, however, the signal wiring 22CMD and the signal wirings 22DQ1 and 22DQ2 are overlaid in the thickness direction, there is a need to consider noise generated from the signal wiring 22CMD. Thus, as shown in FIG. 9, the signal wirings 22CMD are preferably formed in the wiring layer M1 provided at a position different from the positions of the wiring layers M2 and M3. Further, each of the signal wirings 22CMD is preferably formed at a position where it overlaps with any of the reference potential wirings 22VS1, 22VS2, 22VS3, and 22VS4 as viewed in the thickness direction along the extending direction of the reference potential wirings 22VS1, 22VS2, 22VS3, and 22VS4. Thus, since the wiring for supplying the reference potential is interposed between each of the signal wirings 22DQ1 and 22DQ2 and the signal wiring 22CMD, the influence of noise can be reduced.

Incidentally, a reference potential wiring may be further formed in the wiring layer M3 shown in FIG. 9 though its illustration is omitted. Further, the value of the reference potential can further be stabilized by electrically coupling the reference potential wiring and the reference potential wirings 22VS1, 22VS2, 22VS3, and 22VS4.

Further, although part at which the signal wirings 22DQ1 and 22DQ2, and the reference potential wirings 22VS1, 22VS2, 22VS3, and 22VS4 respectively intersect is shown in FIG. 8 in the enlarged form, the wirings 22 are respectively bent at plural points and respectively intersected with the different wirings 22 at the inclination portions inclined with respect to the X direction as shown in FIG. 7.

That is, each of the reference potential wirings 22VS1, 22VS2, 22VS3, and 22VS4 shown in FIG. 8 crosses the reference potential wirings other than the reference potential wirings 22VS1, 22VS2, 22VS3, and 22VS4. Then, the reference potential wirings formed in the different wiring layers are electrically coupled via the via wirings at each portion where they cross each other. In this case, the reference potential can be stabilized at each of coupling portions where the reference potential wirings are coupled to each other. Thus, for example, when the distance between the memory chip 30A and the logic chip 30B both shown in FIG. 7 is apart, and the distance of each wiring 22 becomes long, the potential of the entire transmission path for the reference potential can be stabilized by coupling the reference potential wirings to one another at the plural points according to the distance of each wiring 22.

<Modification 1>

Figure 10:
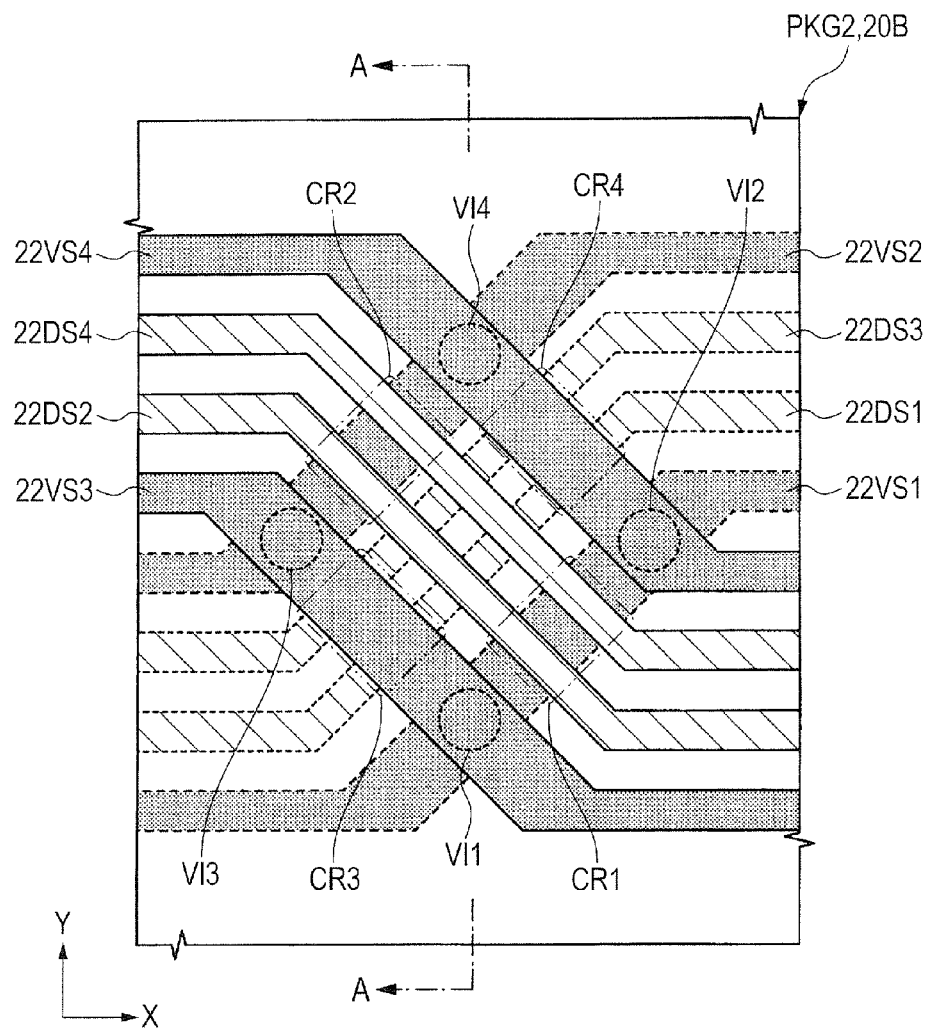
FIG. 10 is an enlarged plan diagram showing a wiring structure of an interposer that a semiconductor device corresponding to a modification relative to FIG. 8 has.

A description will next be made about modifications of the present embodiment. First, as a modification 1, a description will be made about an embodiment applied to a signal transmission path to transmit a differential signal. The example shown in FIG. 8 has been described by taking the so-called embodiment applied to the signal transmission path for the single end signal to facilitate the understanding of the technical idea. The above-described technique is however applicable to the signal transmission path to transmit the differential signal as will be described below. FIG. 10 is an enlarged plan diagram showing a wiring structure of an interposer that a semiconductor device corresponding to a modification relative to FIG. 8 has. Further, FIG. 11 is an enlarged sectional diagram taken along line A-A of FIG. 10.

Incidentally, in FIG. 10, wirings for signal transmission wirings and reference potential wirings are respectively shown attached with different patterns to make it easy to identify them. Further, in FIG. 10, in order to show a plane positional relationship between wirings formed in different wiring layers, the wirings formed in the wiring layer M3 shown in FIG. 11 are indicated by solid lines, and the wirings formed in the wiring layer M2 are indicated by dotted lines.

Figure 11:
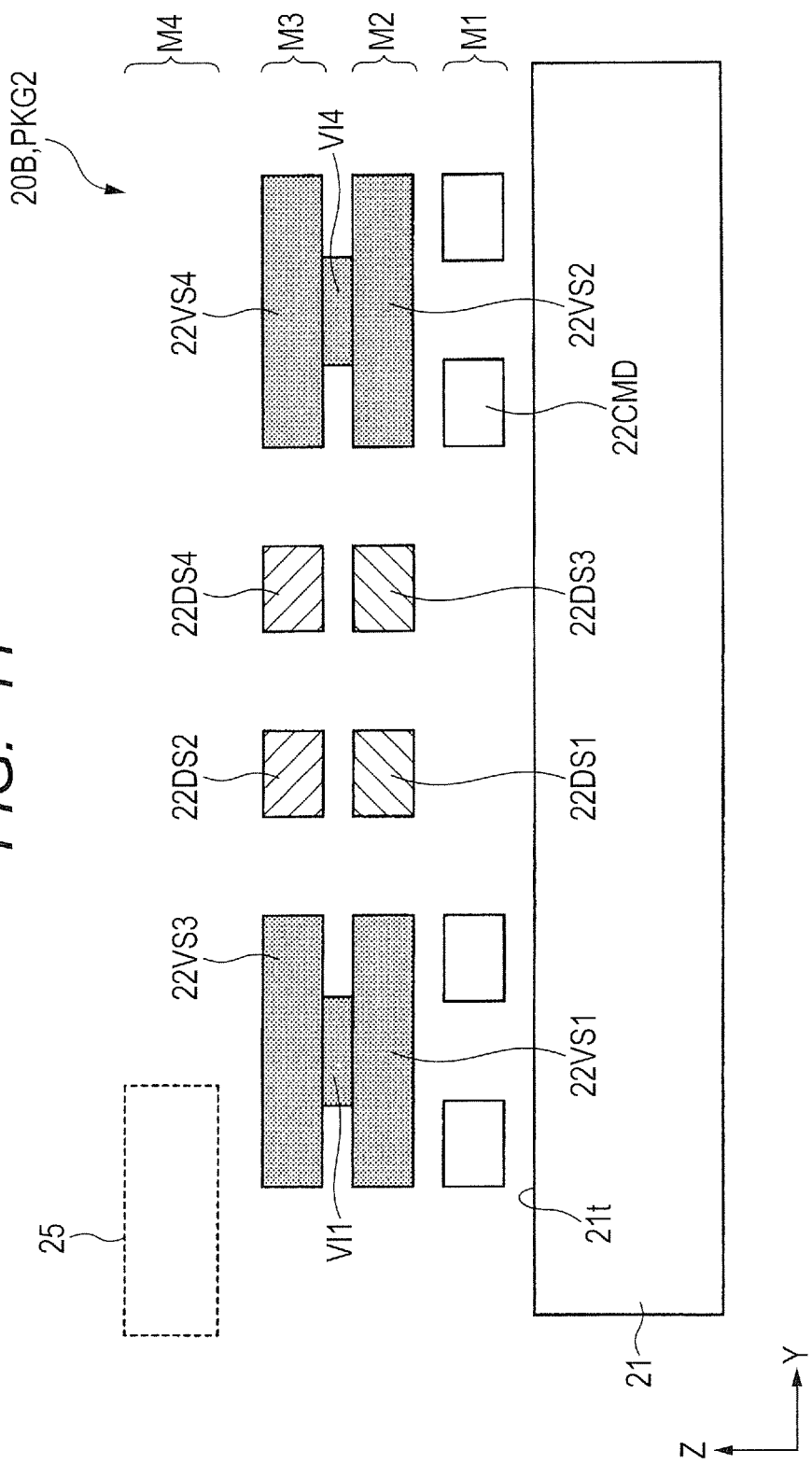
FIG. 11 is an enlarged sectional diagram taken along line A-A of FIG. 10.

Further, FIG. 11 is a sectional diagram, but is attached with different patterns according to the type of transmission target to identify the type of transmission paths configured by a plurality of wirings 22. Further, in FIG. 11, a surface electrode 25 is shown by a dotted line to demonstrate that the wiring layer M4 is a layer for forming each surface electrode 25.

The interposer 20B that the semiconductor device PKG2 shown in FIGS. 10 and 11 is different from the interposer 20B shown in FIG. 7 in that signal wirings for the unit of two are respectively provided between the reference potential wirings. The wiring structure of the interposer 20B shown in FIG. 10 is as follows:

The interposer 20B has the wiring layers M1, M2, and M3 (refer to FIG. 11) including the wiring layer M2 (refer to FIG. 11), and the wiring layer M3 (refer to FIG. 11) laminated over the wiring layer M2. Further, the wiring layer M2 has a reference potential wiring 22VS1 which extends from one of a memory chip 30A (refer to FIG. 7) and a logic chip 30B (refer to FIG. 7) to the other thereof, and a reference potential wiring 22VS2 which extends along the reference potential wiring 22VS1. Further, the wiring layer M3 has a reference potential wiring 22VS3 which extends from one of the memory chip 30A and the logic chip 30B to the other thereof, and a reference potential wiring 22VS4 which extends along the reference potential wiring 22VS3. Then, the reference potential wiring 22VS1 is coupled to the reference potential wiring 22VS3 through a via wiring (coupling portion) VI1 and coupled to the reference potential wiring 22VS4 through a via wiring (coupling portion) VI2. Further, the reference potential wiring 22VS2 is coupled to the reference potential wiring 22VS3 through a via wiring (coupling portion) VI3 and coupled to the reference potential wiring 22VS4 through a via wiring (coupling portion) VI4. The above-described configurations are similar to the interposer 20A shown in FIGS. 8 and 9.

The interposer 20B is however different from FIG. 8 and the interposer 20B shown in FIG. 8 in the following points.

First, the wiring layer M2 has a signal wiring (differential signal wiring) 22DS1 and a signal wiring (differential signal wiring) 22DS3 which extend along the reference potential wiring 22VS1 and the reference potential wiring 22VS2 between the reference potential wiring 22VS1 and the reference potential wiring 22VS2. The signal wiring 22DS1 and the differential signal wiring 22DS3 configure a differential signal pair to transmit a first differential signal.

Further, the wiring layer M3 has a signal wiring (differential signal wiring) 22DS2 and a signal wiring (differential signal wiring) 22DS4 which are electrically isolated from the signal wiring 22DS1 and extend along the reference potential wiring 22VS3 and the reference potential wiring 22VS4 between the reference potential wiring 22VS3 and the reference potential wiring 22VS4. The signal wiring 22DS2 and the differential signal wiring 22DS4 configure a differential signal pair to transmit a second differential signal.

Also, as shown in FIG. 10, the reference potential wiring 22VS1 has a crossing portion CR1 which intersects with the signal wiring 22DS2 and the signal wiring 22DS4 between the via wiring VI1 and the via wiring VI2 in plan view. Further, the reference potential wiring 22VS2 has a crossing portion CR2 which intersects with the signal wiring 22DS2 and the signal wiring 22DS4 between the via wiring VI3 and the via wiring VI4 in plan view. Moreover, the reference potential wiring 22VS3 has a crossing portion CR3 which intersects with the signal wiring 22DS1 and the signal wiring 22DS3 between the via wiring VI1 and the via wiring VI3 in plan view. Besides, the reference potential wiring 22VS4 has a crossing portion CR4 which intersects with the signal wiring 22DS1 and the signal wiring 22DS3 between the via wiring VI2 and the via wiring VI4 in plan view.

As in the modification shown in FIGS. 10 and 11, when the signal wirings provided between the reference potential wirings are of the differential signal wirings, it is necessary to arrange the value of a reference potential to which each differential pair refers, to the same value. According to the present modification, since the reference potential wiring 22VS1 and the reference potential wiring 22VS2 are electrically coupled at the plural points, it is easy to arrange the potential of the reference potential wiring 22VS1 and the potential of the reference potential wiring 22VS2 to the same potential. That is, it is easy to arrange the value of the reference potential to which each of the signal wiring 22DS1 and the signal wiring 22DS3 configuring a differential pair refers, to the same value. It is thus possible to improve the reliability of signal transmission of each differential signal.

<Modification 2>

Next, as a modification 2, a description will be made about an embodiment in which signal wirings formed in different wiring layers are provided so as not to intersect each other. The example shown in FIG. 8 and the above modification 1 respectively have described the embodiment in which the reference potential wirings formed in the plural wiring layers are electrically coupled through the via wirings by being crossed with each other to thereby achieve stabilization of the reference potential. If, however, at least some of the reference potential wirings formed in the wiring layers are provided so as to overlap in the thickness direction, the reference potential wirings can be electrically coupled at their overlapped portion. In the present modification, a description will be made about an embodiment where some of a plurality of reference potential wirings are overlaid in a thickness direction.

Figure 12:
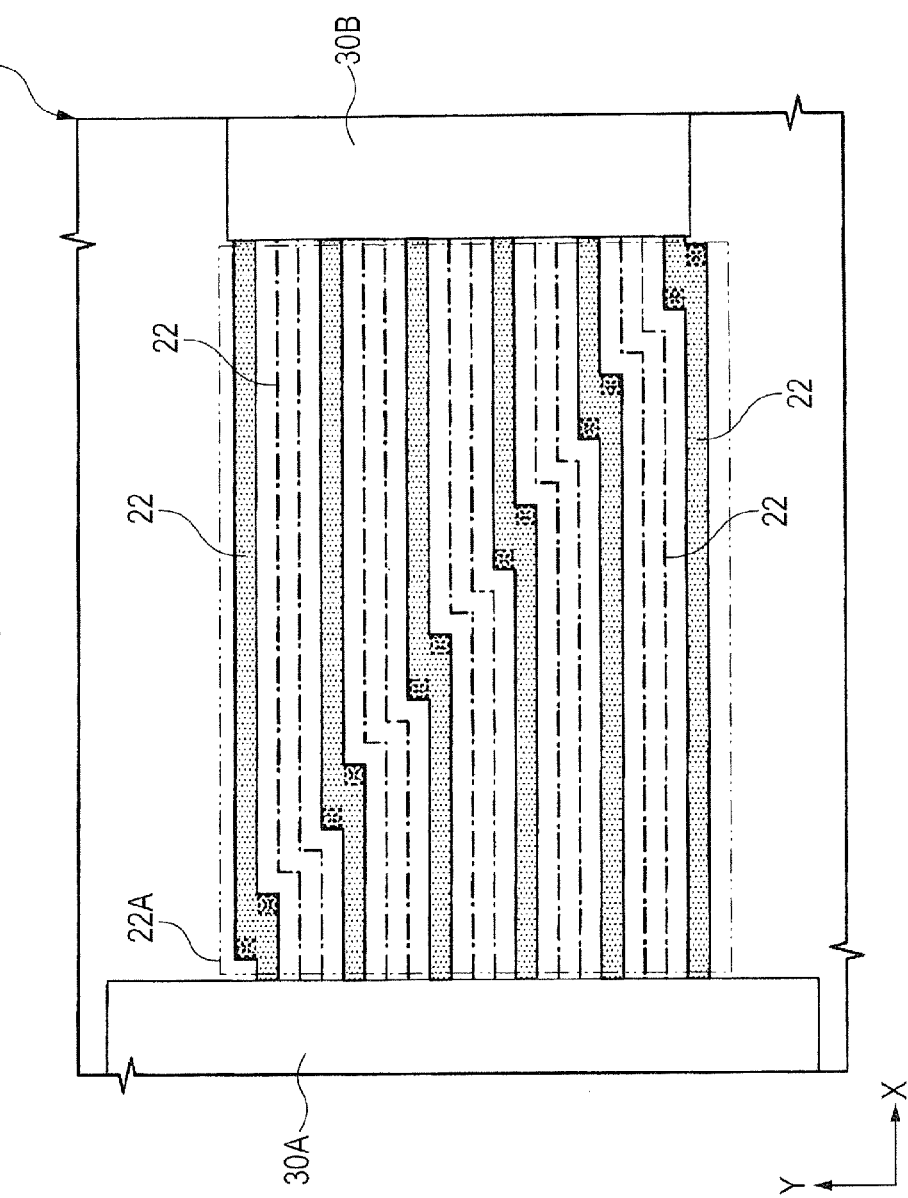
FIG. 12 is an enlarged plan diagram showing a wiring structure of an interposer that a semiconductor device corresponding to a modification relative to FIG. 7 has.
Figure 13:
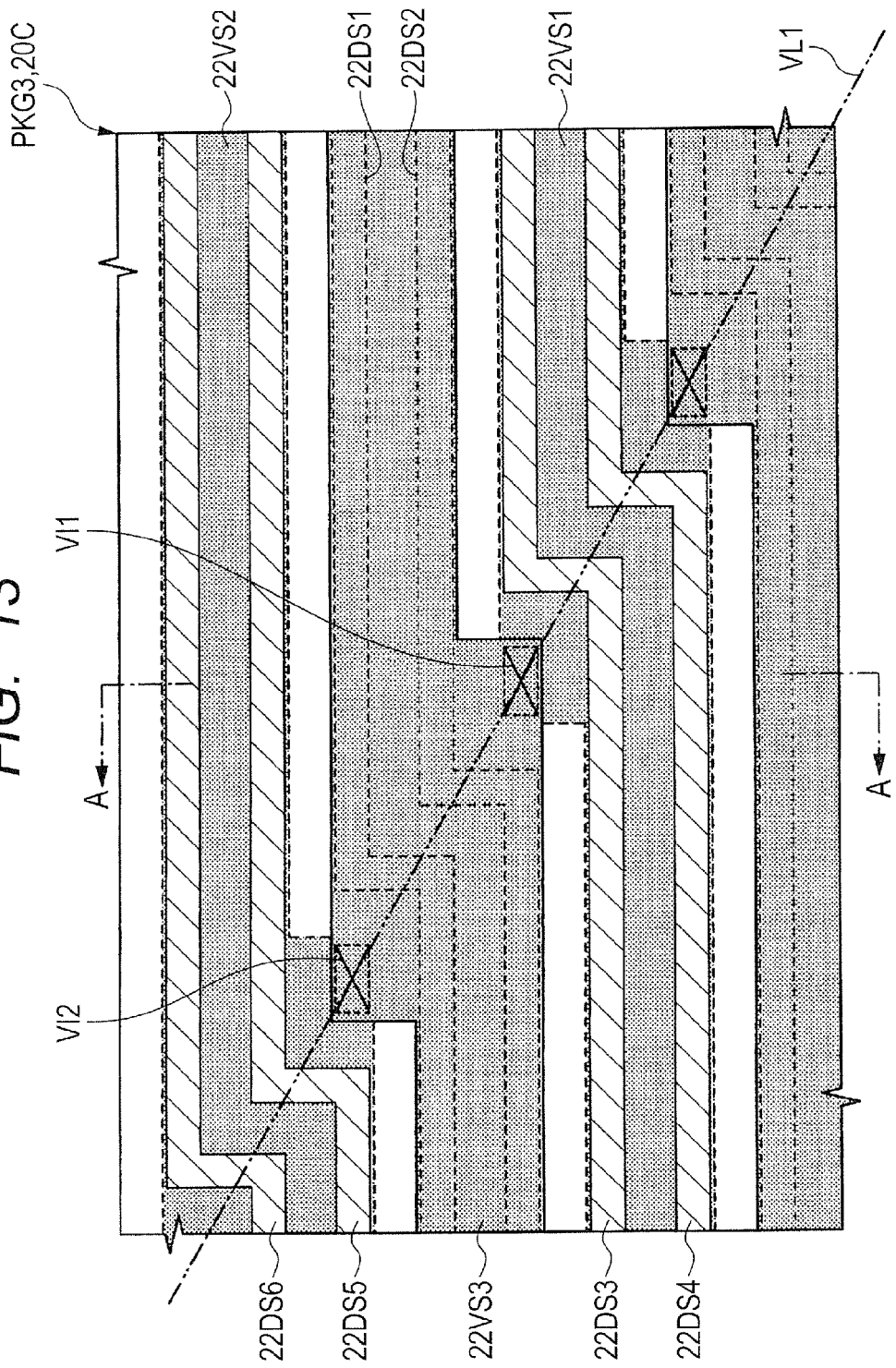
FIG. 13 is an enlarged plan diagram showing in a further enlarged form, part of an area in which a plurality of wirings shown in FIG. 12 are formed.

FIG. 12 is an enlarged plan diagram showing a wiring structure of an interposer that a semiconductor device corresponding to a modification relative to FIG. 7 has. Further, FIG. 13 is an enlarged plan diagram showing in a further enlarged form, part of an area in which a plurality of wirings shown in FIG. 12 are formed. Moreover, FIG. 14 is an enlarged sectional diagram taken along line A-A of FIG. 13.

Incidentally, in FIG. 12, the wirings of the wiring layer M3 shown in FIG. 9 are illustrated to show a layout example of wirings for electrically coupling a memory chip 30A and a logic chip 30B. Further, in FIGS. 12 and 13, signal transmission wirings and reference potential wirings are respectively shown attached with different patterns to make it easy to identify them. In FIG. 12, signal wirings 22 are respectively indicated by dashed lines, and thick reference potential wirings 22 are respectively attached with patterns. In FIG. 13, reference potential wirings are shown with dot patterns, and of the signal wirings, the signal wirings 22DS3, 22DS4, 22DS5, 22DS6 are shown by hatching. Further, there is typically shown in FIG. 12, an image of a wiring layout. Therefore, as the number of the wirings 22, the number of bent portions, etc. there are mentioned various modifications in addition to the embodiment shown in FIG. 12. Further, the range of an area 22A interposed between the memory chip 30A and the logic chip 30B disposed side by side is shown by a two-dot chain line.

Further, in FIG. 13, each wiring formed in the wiring layer M3 shown in FIG. 9 is shown by a solid line, and each wiring formed in the wiring layer M2 shown in FIG. 9 is shown by a dotted line in order to show a plane positional relationship between the wirings formed in the different wiring layers.

Figure 14:
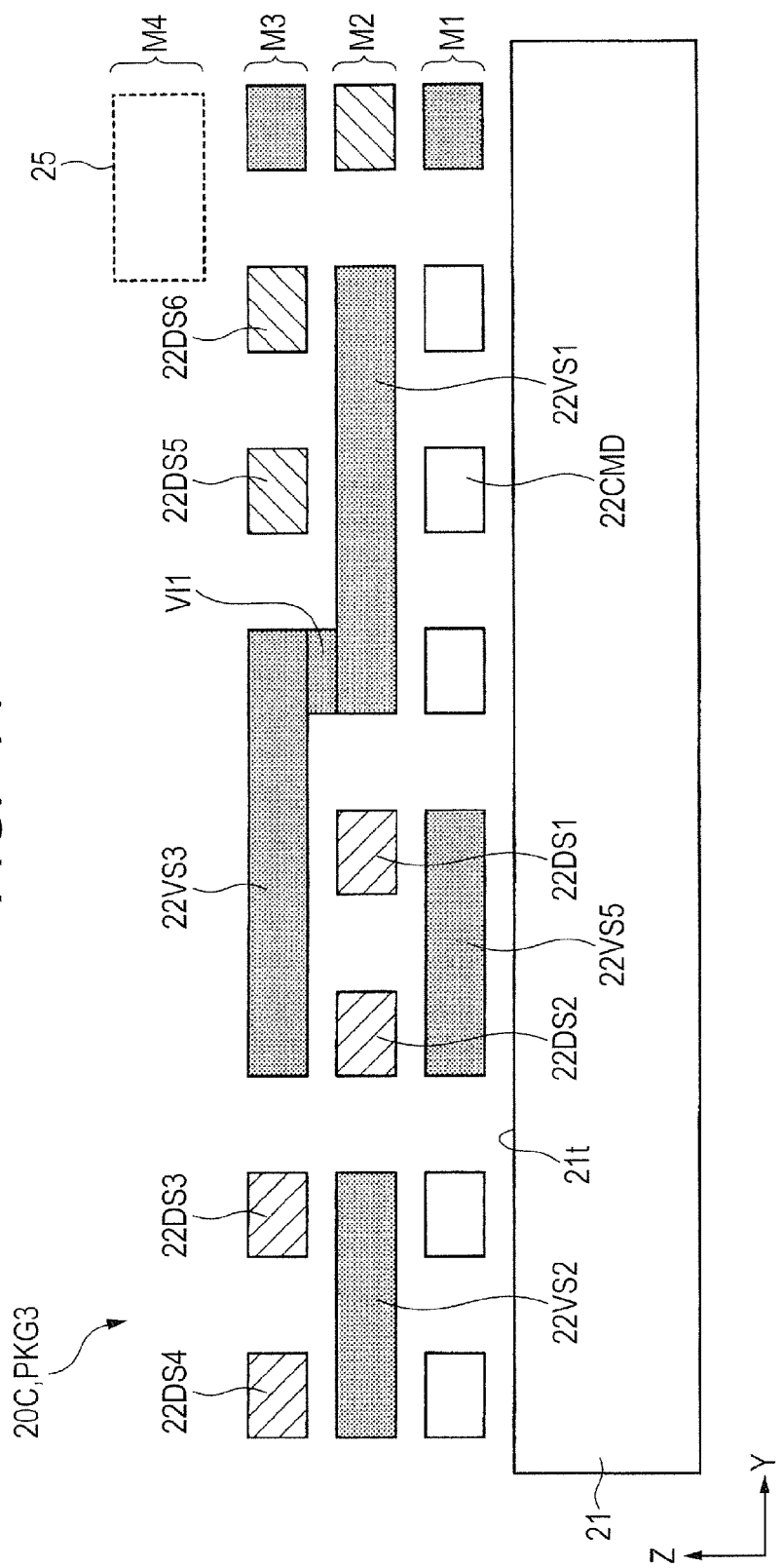
FIG. 14 is an enlarged sectional diagram taken along line A-A of FIG. 13.

Furthermore, FIG. 14 is a sectional diagram, but is attached with different patterns according to the type of transmission target in order to identify the type of transmission paths configured by the wirings 22. Besides, in FIG. 14, a surface electrode 25 is shown by a dotted line to demonstrate that the wiring layer M4 is a layer for forming the surface electrode 25.

The interposer 20C that the semiconductor device PKG3 according to the present modification has the wiring layers M1, M2, and M3 (refer to FIG. 14) including the wiring layer M2 (refer to FIG. 14), and the wiring layer M3 (refer to FIG. 14) laminated over the wiring layer M2. Further, the wiring layer M2 has a reference potential wiring 22VS1 which extends from one of the memory chip 30A (refer to FIG. 12) and the logic chip 30B (refer to FIG. 12) to the other thereof, and a reference potential wiring 22VS2 which extends along the reference potential wiring 22VS1. In addition, the wiring layer M2 has a signal wiring (differential signal wiring) 22DS1 and a signal wiring (differential signal wiring) 22DS2 which extend along the reference potential wiring 22VS1 and the reference potential wiring 22VS2 between the reference potential wiring 22VS1 and the reference potential wiring 22VS2.

Further, the wiring layer M3 (refer to FIG. 14) has a signal wiring (differential signal wiring) 22DS3 and a signal wiring (differential signal wiring) 22DS4 which are electrically isolated from the signal wiring 22DS1 and the signal wiring 22DS2 and extend along the reference potential wiring 22VS1. Moreover, the wiring layer M3 has a signal wiring (differential signal wiring) 22DS5 and a signal wiring (differential signal wiring) 22DS6 which are electrically isolated from the signal wiring 22DS1 and the signal wiring 22DS2 and extend along the reference potential wiring 22VS2. Besides, the wiring layer M3 has a reference potential wiring 22VS3 which is provided between the signal wiring 22DS3 and the signal wiring 22DS5 and extends along the signal wiring 22DS1 and the signal wiring 22DS2.

Moreover, the reference potential wiring 22VS3 is coupled to the reference potential wiring 22VS1 through a via wiring (coupling portion) VI1 and coupled to the reference potential wiring 22VS2 through a via wiring (coupling portion) VI2. Further, as shown in FIG. 13, the reference potential wiring 22VS1, the reference potential wiring 22VS2, and the reference potential wiring 22VS3 are respectively bent in areas that overlap with a virtual line VL1 directly passing through the via wiring VI1 and the via wiring VI2.

In other words, the reference potential wiring 22VS1, the reference potential wiring 22VS2, and the reference potential wiring 22VS3 are respectively bent. In areas which overlap with the virtual line VL1 linearly coupling their bent portions, the reference potential wiring 22VS3 is superposed on the reference potential wiring 22VS1 and the reference potential wiring 22VS2 with respect to each other. Then, the reference potential wiring 22VS3 is coupled to the reference potential wiring 22VS1 through the via wiring VI1 at a portion where the reference potential wiring 22VS3 and the reference potential wiring 22VS1 overlap each other. Further, the reference potential wiring 22VS3 is coupled to the reference potential wiring 22VS2 through the via wiring VI2 at a portion where the reference potential wiring 22VS3 and the reference potential wiring 22VS2 overlap each other.

Thus, according to the present modification, some of the reference wirings are arranged so as to overlap in the thickness direction by forming the bent portions at the reference potential wirings and the signal wirings respectively. Besides, the reference potential wirings formed in the different wiring layers are electrically coupled to each other by using the portions overlapped in the thickness direction. Further, as shown in FIG. 13, the portions where the wirings are respectively bent, in other words, the portions where the via wirings as the coupling portions are provided, are arranged linearly in plan view, thereby making it possible to arrange the wirings in high density.

Further, according to the present modification, as shown in FIGS. 12 and 13, the reference potential wirings and the wirings for signal transmission are not crossed with each other. Therefore, the wirings can be routed in such a manner that the reference potential wirings are arranged in the upper or lower layers of the signal wirings, and the signal wirings and the reference potential wirings are maintained in a state of being superimposed in the thickness direction.

In the example shown in FIG. 14, the signal wiring 22DS1 and the signal wiring 22DS2, and the reference potential wiring 22VS3 are provided at a position where they overlap in the thickness direction, within the area 22A (refer to FIG. 12) interposed between the memory chip 30A (refer to FIG. 12) and the logic chip 30B (refer to FIG. 12). Also, in the area 22A, the signal wiring 22DS3 and the signal wiring 22DS4, and the reference potential wiring 22VS2 are provided at a position where they overlap in the thickness direction. Further, in the area 22A, the signal wiring 22DS1 and the signal wiring 22DS2, and the reference potential wiring 22VS3 are provided at a position where they overlap in the thickness direction.

As in the present modification, when the reference potential wirings are provided at the upper or lower layers of the signal wirings at the majority of the signal transmission paths, electromagnetic waves generated by the flow of current through each signal transmission path can be shielded. For example, in the example shown in FIG. 14, a signal wiring 22CMD is formed in the wiring layer M1 at a position where it overlaps with the signal wiring 22DS3 formed in the wiring layer M3 in the thickness direction.

However, the reference potential wiring 22VS1 is disposed between the signal wiring 22DS3 and the signal wiring 22CMD to thereby make it possible to reduce an influence of crosstalk between the signal transmission paths through which different signal are transmitted.

Further, in the case of the example shown in FIG. 14, the reference potential wirings are provided on both neighboring sides of the pair of signal wirings configuring each differential pair. For example, the reference potential wiring 22VS1 and the reference potential wiring 22VS2 are provided on both neighboring sides of the signal wiring 22DS1 and the signal wiring 22DS2 configuring the differential pair. Further, since the reference potential wiring 22VS1 and the reference potential wiring 22VS2 are electrically coupled to each other as described above, the potential can be stabilized. Therefore, electromagnetic waves generated by the flow of a signal current through each of the signal wiring 22DS1 and the signal wiring 22DS2 can be shielded by the reference potential wirings 22VS1, 22VS2, and 22VS3.

Incidentally, as in the example shown in FIG. 14, if a reference potential wiring 22VS5 is provided within the wiring layer M1 at a position where it overlaps with the signal wiring 22DS1 and the signal wiring 22DS2 in the thickness direction, where the other wiring layer M1 exists between the wiring layer M2 and the silicon substrate 21, a shield effect is further improved. For example, the plane shape of the reference potential wiring 22VS5 shown in FIG. 14 is the same shape as the reference potential wiring 22VS3 shown in FIG. 13. Therefore, in the area 22A (refer to FIG. 12), the whole of the signal wiring 22DS1 and the signal wiring 22DS2 is placed in a state of being sandwiched between the reference potential wiring 22VS3 and the reference potential wiring 22VS5. Thus, electromagnetic waves generated by the flow of a signal current through each of the signal wiring 22DS1 and the signal wiring 22DS2 are shielded by the reference potential wirings 22VS1, 22VS2, 22VS3, and 22VS5.

According to the present modification as described above, it is possible to stabilize the potential of each of the reference potential wirings arranged around the signal wiring 22DS1 and the signal wiring 22DS2. Therefore, even when other signal wirings 22DS5 and 22DS3, etc. are arranged in the vicinity of the signal wiring 22DS1 and the signal wiring 22DS2, crosstalk noise between the signal transmission paths can be reduced. In other words, according to the present modification, since the crosstalk noise between the signal transmission paths can be reduced, a plurality of signal transmission paths can be formed in high density.

Incidentally, the present modification has descried the signal transmission paths through which the differential signals are transmitted, as the example of the embodiment in which some of the reference potential wirings formed in the wiring layers are provided so as to overlap in the thickness direction, and the reference potential wirings are electrically coupled at the overlapped portions. The present modification may however be applied to the so-called signal transmission path of the single end signal such as described using FIGS. 7 to 9. In the case of the application to the single end signal, though illustration is omitted, the present modification may be applied except for the signal wiring 22DS2, the signal wiring 22DS4, and the signal wiring 22DS6 of the wirings shown in FIG. 14. Further, as another modification relative to FIG. 14, the single end signal may be transmitted using each of the signal wirings 22DS1 to 22DS6 under the same structure as the semiconductor device PKG3 shown in FIG. 14.

Embodiment 2

The above-described embodiment 1 has described the technique of improving the reliability of each signal transmission path by electrically coupling the reference potential wirings provided along the signal transmission paths to each other and stabilizing the value of each reference potential. The present embodiment will describe a technique of crossing a plurality of signal wirings with each other in plan view to thereby reduce crosstalk noise between a plurality of signal transmission paths.

Incidentally, a semiconductor device PKG4 according to the present embodiment to be described below is different from the semiconductor devices PKG1, PKG2, and PKG3 described in the above embodiment 1 in terms of a wiring structure of an interposer 20D. Since, however, parts other than the wiring structure of the interposer 20D are similar to those in the semiconductor devices PKG1, PKG2, and PKG3 described in the above embodiment 1, their dual description will be omitted.

Figure 15:
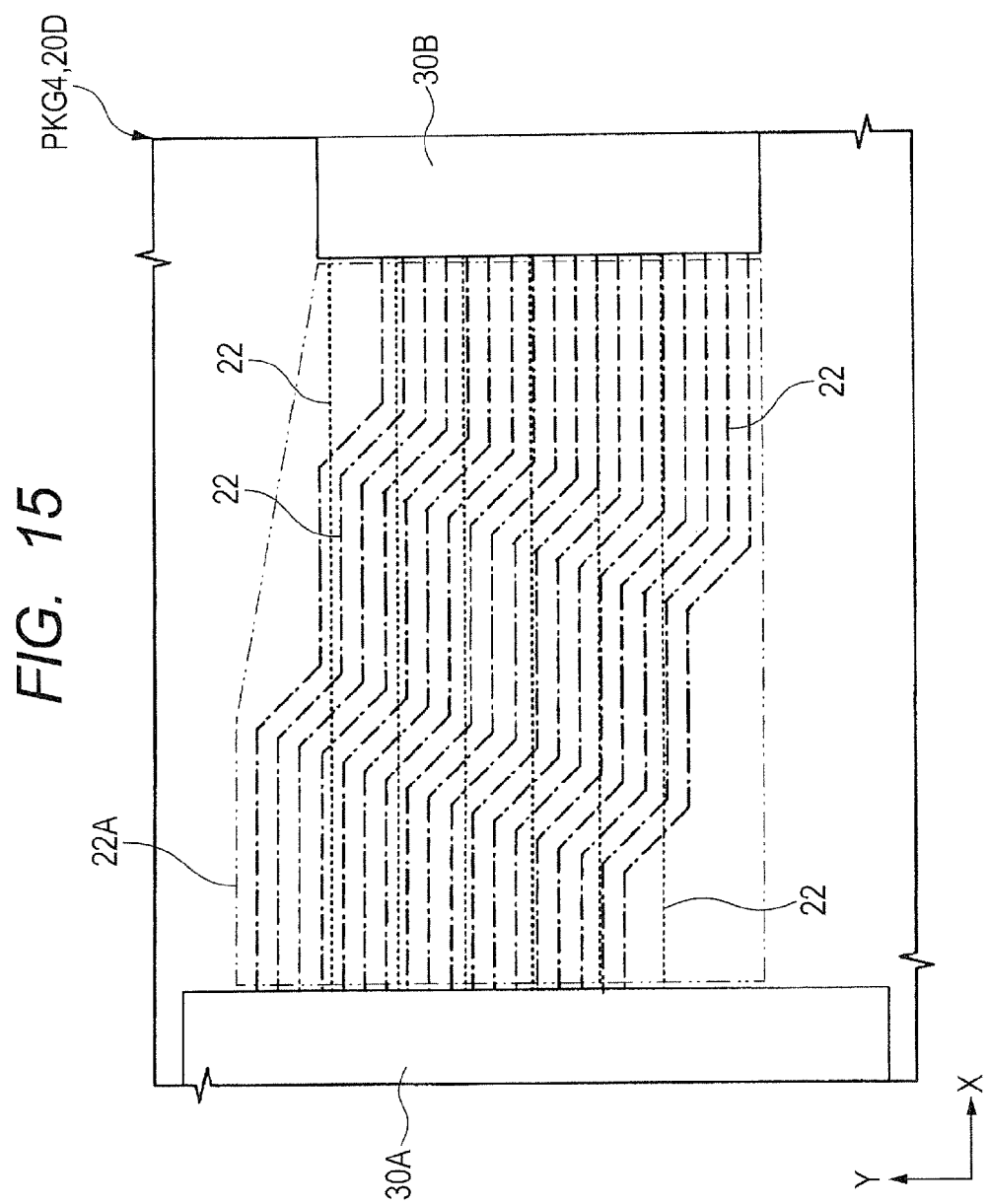
FIG. 15 is an enlarged plan diagram showing a wiring structure of an interposer that a semiconductor device corresponding to a modification relative to FIG. 7 has.
Figure 16:
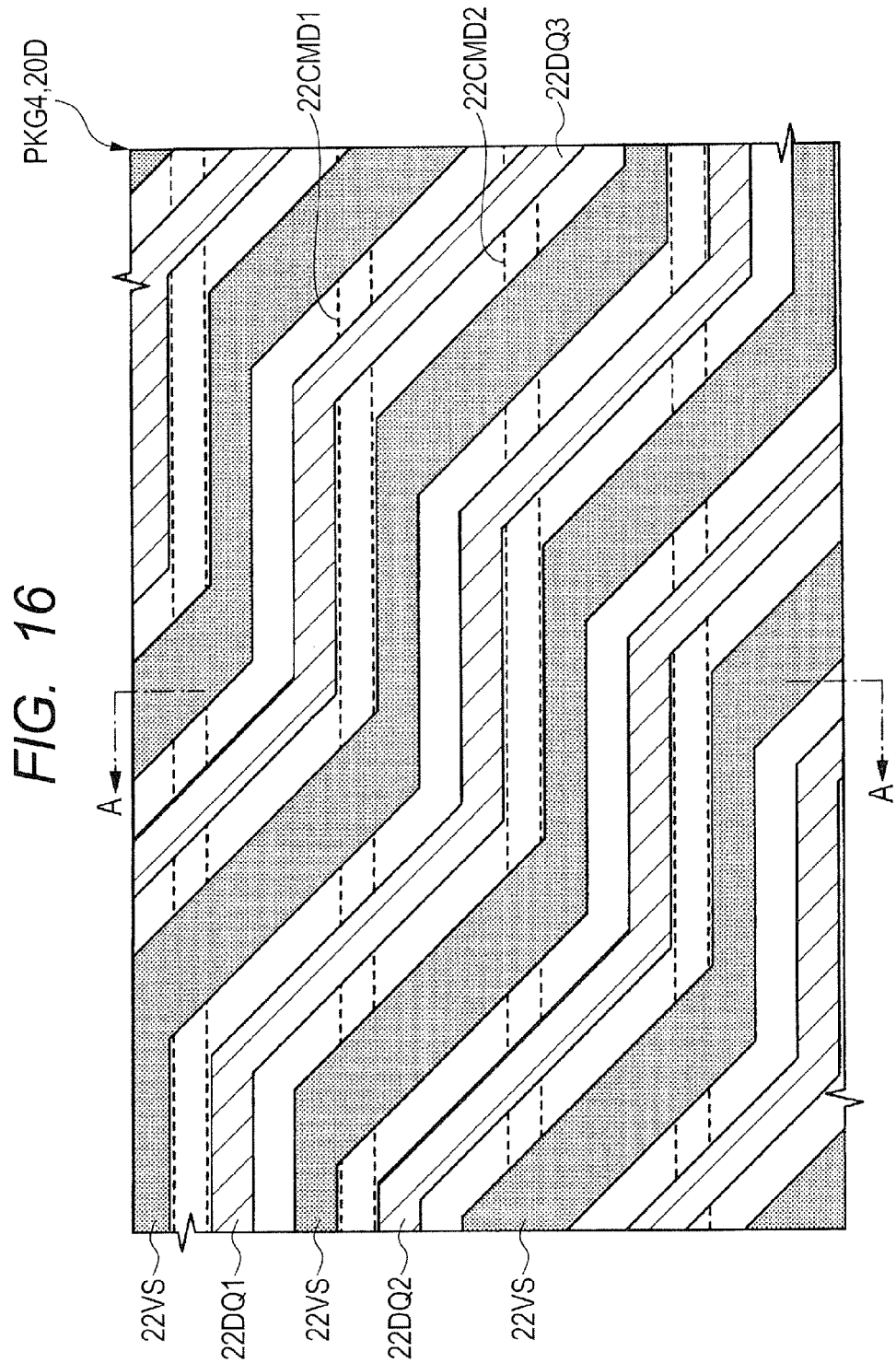
FIG. 16 is an enlarged plan diagram showing in a further enlarged form, part of an area in which a plurality of wirings shown in FIG. 15 are formed.
Figure 17:
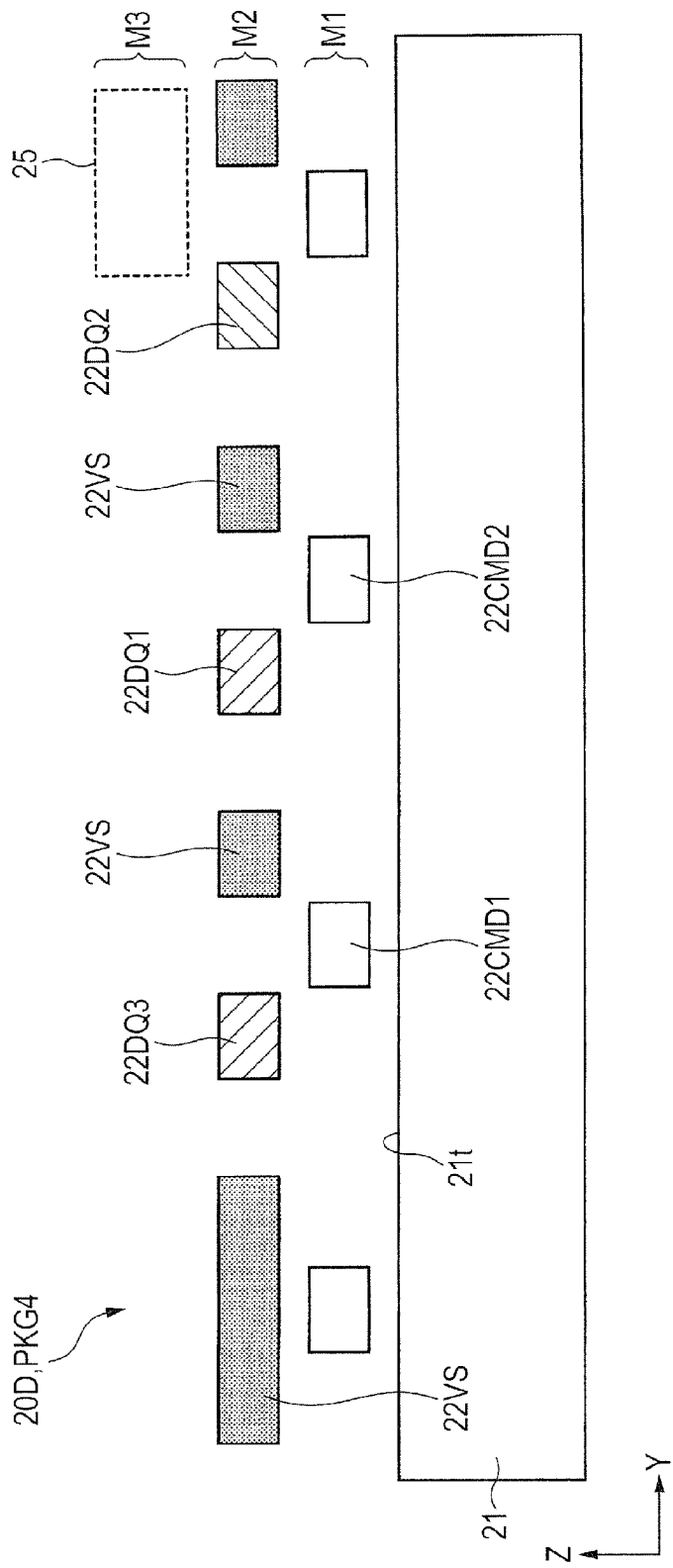
FIG. 17 is an enlarged sectional diagram taken along line A-A of FIG. 16.
Figure 18:
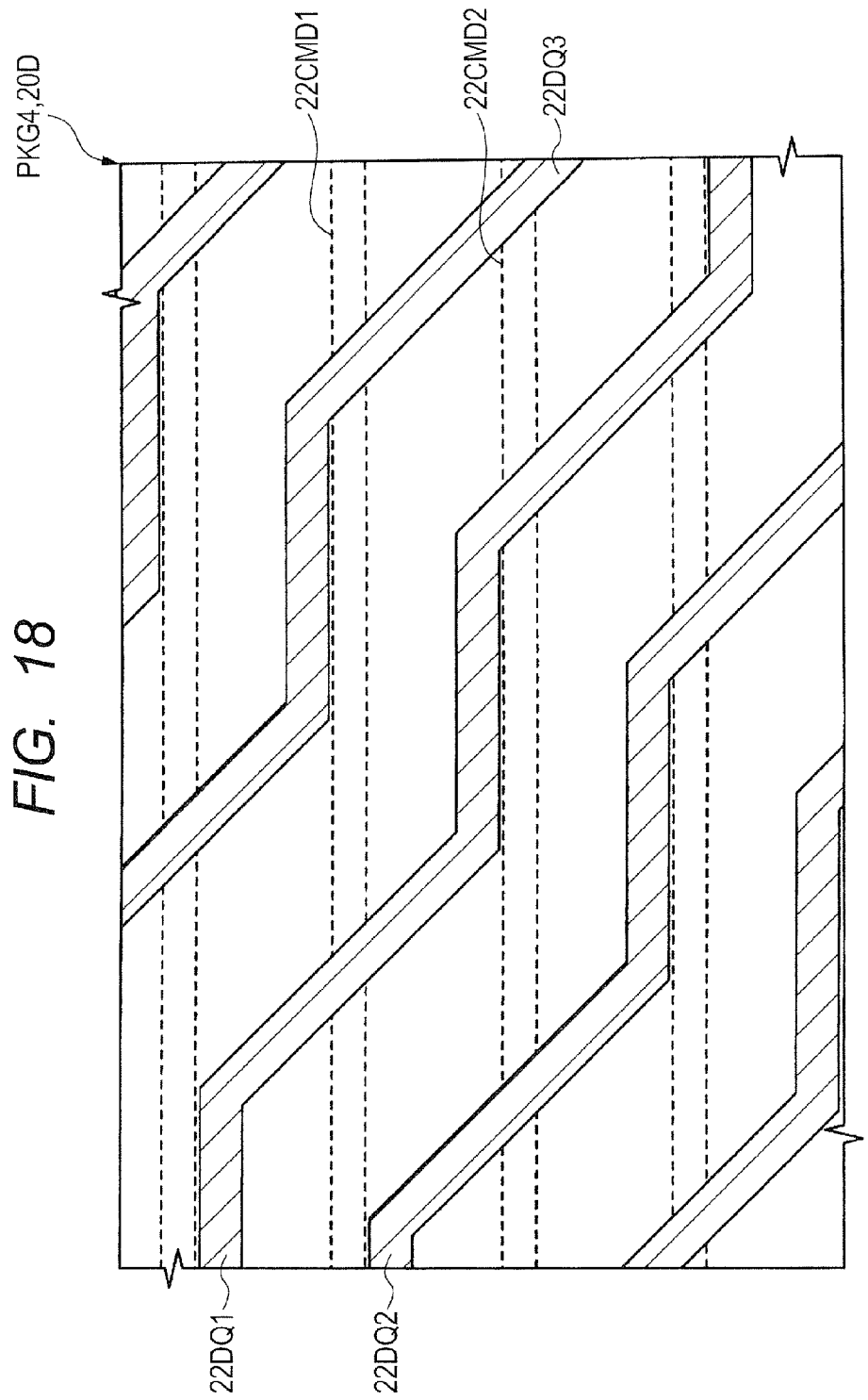
FIG. 18 is an enlarged plan diagram showing a state in which reference potential wirings shown in FIG. 16 are excluded.

FIG. 15 is an enlarged plan diagram showing a wiring structure of an interposer that a semiconductor device corresponding to a modification relative to FIG. 7 has. Also, FIG. 16 is an enlarged plan diagram showing in a further enlarged form, part of an area in which a plurality of wirings shown in FIG. 15 are formed. Further, FIG. 17 is an enlarged sectional diagram taken along line A-A of FIG. 16. Moreover, FIG. 18 is an enlarged plan diagram showing a state in which reference potential wirings shown in FIG. 16 are excluded. FIG. 18 is illustrated in the state in which the reference potential wirings shown in FIG. 16 are excluded to show a plane positional relationship between signal wirings in an easy-to-see manner.

Incidentally, in FIG. 15, in order to show a layout example of wirings for electrically coupling a memory chip 30A and a logic chip 30B, wirings in a wiring layer M2 shown in FIG. 17 are indicated by dashed lines and wirings in a wiring layer M1 shown in FIG. 17 are indicated by dotted lines. Further, there is typically shown in FIG. 15, an image of a wiring layout. Therefore, as the number of wirings 22, the number of bent portions, etc. there are mentioned various modifications in addition to the embodiment shown in FIG. 7. Further, in FIG. 15, the range of an area 22A sandwiched between the memory chip 30A and the logic chip 30B disposed side by side is shown by a two-dot chain line.

Also, in FIG. 16, each wiring for signal transmission and each wiring for the reference potential are shown attached with patterns different from each other in order to make it easy to identify them. Further, in FIGS. 16 and 18, each wiring formed in the wiring layer M2 shown in FIG. 17 is shown by a solid line, and each wiring formed in the wiring layer M1 shown in FIG. 17 is shown by a dotted line in order to show a plane positional relationship between wirings formed in different wiring layers.

Furthermore, FIG. 17 is a sectional diagram, but is attached with different patterns according to the type of transmission target in order to identify the type of transmission paths configured by the wirings 22. Besides, in FIG. 17, a surface electrode 25 is shown by a dotted line to demonstrate that a wiring layer M3 is a layer for forming the surface electrode 25.

The interposer 20D that the semiconductor device PKG4 according to the present embodiment has includes the wiring layer M1 (refer to FIG. 17), and the wiring layer M2 (refer to FIG. 17) laminated over the wiring layer M1. The wiring layer M1 is provided with a signal wiring (data signal wiring) 22DQ1 which electrically couple the memory chip 30A (refer to FIG. 15) and the logic chip 30B (refer to FIG. 15). Further, the wiring layer M2 is provided with a signal wiring (control signal wiring) 22CMD1 and a signal wiring (control signal wiring) 22CMD2 which electrically couple the memory chip 30A and the logic chip 30B and are electrically isolated from the signal wiring 22DQ1. Besides, as shown in FIGS. 16 and 18, the signal wiring 22DQ1 crosses the signal wiring 22CMD1 and the signal wiring 22CMD2 in plan view.

According to the examinations of the inventors of the present application, it has turned out that since the signal wiring 22DQ1 is provided so as to cross the signal wiring 22CMD1 and the signal wiring 22CMD2 as shown in FIG. 18, the influence of crosstalk noise to the signal wiring 22DQ1 can be reduced. The reason for that will be described below. Incidentally, crosstalk noise between different signal transmission paths interacts with a plurality of transmission paths. For easiness to understand, however, the signal wiring 22DQ1, and the signal wiring 22CMD1 and the signal wiring 22CMD2 will respectively be described below as a victim wiring and aggressor wirings. In other words, a description will be made about the influence of crosstalk noise caused by a signal current flowing through each of the signal wiring 22CMD1 and the signal wiring 22CMD2 on the signal wiring 22DQ1.

The influence of crosstalk noise between wirings occurs in the following situations, for example. First assume that a low signal low in potential or a high signal higher in potential than the low signal flows through each of the victim and aggressor wirings. For example, when the high signal flows through the aggressor wiring where the low signal is flowing through the victim wiring (signal wiring 22DQ1 shown in FIG. 18, for example), the victim wiring is affected by the potential of the aggressor wiring. That is, the victim wiring is affected by crosstalk noise. For example, when the aggressor wiring and the victim wiring are extended so as to run in parallel, the probability that the influence of crosstalk noise on the victim wiring is maximized is ¼.

At this time, the degree of the influence of crosstalk noise between the wirings becomes large in inverse proportion to the distance between the wirings. That is, the smaller the separation distance between the victim wiring and the aggressor wiring, the greater the influence of crosstalk noise. Further, when two different transmission paths are extended so as to run in parallel, the degree of the influence of crosstalk between the wirings becomes large in proportion to the parallel running distance between the two wirings. That is, the larger the parallel distance between the wirings, the greater the influence of crosstalk noise. Thus, in order to reduce the influence of crosstalk noise on the victim wiring when the wiring density is improved, there is a need to shorten the parallel running distance between the victim wiring and the aggressor wiring.

Here, as shown in FIG. 18, in the present embodiment, the signal wiring 22DQ1 is provided so as to cross the signal wiring 22CMD1 and the signal wiring 22CMD2. Therefore, the signal wiring 22DQ1 has portions which run in parallel with the signal wiring 22CMD1, and a portion which runs in parallel with the signal wiring 22CMD2. Then, for example, the probability that the low signal flows through the signal wiring 22DQ1, and the high signal flows through both of the signal wiring 22CMD1 and the signal wiring 22CMD2 is ⅛. Thus, as compared with the case where the signal wiring 22DQ1 extends in parallel with either of the signal wiring 22CMD1 and the signal wiring 22CMD2, the probability that the influence of crosstalk noise is maximized becomes half.

Further, in FIG. 18, when the number of the aggressor wirings crossing the victim wiring is further increased although being two, the probability that the influence of crosstalk noise is maximized is further lowered. That is, the influence of the crosstalk noise can be reduced by increasing the number of the aggressor wirings crossing the victim wiring.

Moreover, according to the examinations of the inventors of the present application, when the signal wirings different in the frequency for signal transmission exist, the signal wiring relatively high in frequency is susceptible to the influence of crosstalk noise. For example, in the example shown in FIG. 18, the signal transmission frequency of each of the signal wirings (data signal wirings) 22DQ1, 22DQ2, and 22DQ3 is higher than the signal transmission frequency of each of the signal wirings (control signal wirings) 22CMD1 and 22CMD2. Thus, each of the signal wirings 22DQ1, 22DQ2, and 22DQ3 is preferably arranged so as to intersect with the aggressor wirings.

When, however, the wiring density is improved, the separation distances between the signal wirings 22DQ1, 22DQ2 and 22DQ3 formed in the same wiring layer M2 (refer to FIG. 17) become small. In the present embodiment, however, as shown in FIG. 16, the reference potential wirings 22VS are respectively formed between the signal wirings 22DQ1, 22DQ2, and 22DQ3. Therefore, it is possible to reduce the influence of mutual crosstalk noise between the signal wirings 22DQ1, 22DQ2, and 22DQ3 by a shield effect of each reference potential wiring.

However, the reference potential wirings 22VS shown in FIG. 16 may not be formed in terms of reducing crosstalk noise between the signal wirings 22CMD1 and 22CMD2 formed in the wiring layer M1 and the signal wirings 22DQ1, 22DQ2, and 22DQ3 formed in the wiring layer M2.

Further, in the example described using FIGS. 15 to 18, each transmission path for the data signal high in frequency is provided in the wiring layer M2, and the control signal wirings low in frequency are provided in the wiring layer M1. There are however various modifications depending on the number of signal transmission paths.

For example, when the number of the signal wirings to transmit the data signals is further increased, the signal wirings for the data signals may be formed in both of the wiring layer M1 and the wiring layer M2. Alternatively, another wiring layer is added between the wiring layers M2 and M3 shown in FIG. 17, and data signal wirings may be provided in the added wiring layer.

Moreover, in the example described using FIGS. 16 and 18, each of the wirings formed in the wiring layer M2 has a portion bent in a Y direction for simplification. On the other hand, each of the wirings formed in the wiring layer M1 is not bent in the Y direction. However, the technique described in the present embodiment is intended to shorten the distance at which one victim wiring and one aggressor wiring run in parallel, by arranging the victim wiring so as to cross the aggressor wirings. Therefore, at least one of the victim and aggressor wirings may be bent in the Y direction. Thus, for example, each of the signal wirings 22CMD1 and 22CMD2 shown in FIG. 18 may have a portion bent in the Y direction.

Although the invention made above by the present inventors has been described specifically on the basis of the preferred embodiments, the present invention is not limited to the embodiments referred to above. It is needless to say that various changes can be made thereto within the scope not departing from the gist thereof.

For example, in the above embodiment, the embodiment using the silicon interposer as the interposer has been descried in which the wiring layers are formed over the silicon substrate 21. The silicon interposer has the advantage of making it easy to improve the wiring density since the process similar to the process of forming the wirings in the semiconductor wafer can be utilized as described in the above embodiment 1.

A technique of thinning a multilayer resin substrate in which a plurality of wiring layers are laminated via an organic insulating layer has recently been advanced. Even in the multilayer resin substrate, a wiring width, the thickness of a wiring layer, or the thickness of an interlayer insulating film that get closer to the silicon interposer has been brought into realization. Thus, the technique described in the above embodiment can also be applied to an interposer having a multilayer resin substrate.

Further, for example, although the various modifications have respectively been described in the embodiments, the respective modifications may be applied in combination with each other within the scope not departing from the gist thereof.

For example, the semiconductor device PKG1 shown in FIG. 7 is configured as an embodiment in which the technique described in the embodiment 1 and the technique described in the embodiment 2 are applied in combination. That is, as shown in FIG. 7, the wirings 22 includes therein the signal wiring 22DQ3 formed in the wiring layer different from that for the signal wiring 22DQ1 in addition to the signal wiring 22DQ1 and the signal wiring 22DQ2. Further, as shown in FIG. 7, the signal wiring 22DQ1 has a crossing portion CR5 which crosses the signal wiring 22DQ2, and a crossing portion CR6 which crosses the signal wiring 22DQ3. Thus, since the distance at which the signal wiring 22DQ1 runs in parallel with the signal wiring 22DQ2 in the vicinity of the signal wiring 22DQ2, and the distance at which the signal wiring 22DQ1 runs in parallel with the signal wiring 22DQ3 in the vicinity of the signal wiring 22DQ3 are made short, crosstalk noise can be reduced.

What is claimed is:

1. A semiconductor device, comprising:
   a wiring substrate;
   an interposer mounted over a first surface of the wiring substrate;
   a first semiconductor chip mounted over the interposer; and
   a second semiconductor chip which is mounted over the interposer side by side with the first semiconductor chip and controls the first semiconductor chip,
   wherein the interposer has a plurality of wiring layers including a first wiring layer, and a second wiring layer laminated over the first wiring layer,
   wherein the first semiconductor chip and the second semiconductor chip are electrically coupled through a plurality of wirings formed in the wiring layers of the interposer,
   wherein the wirings includes:
      a first reference potential wiring formed in the first wiring layer and extending from one of the first semiconductor chip and the second semiconductor chip to the other thereof,
      a second reference potential wiring formed in the first wiring layer and extending along the first reference potential wiring,
      a first signal wiring formed in the first wiring layer and extending along the first reference potential wiring and the second reference potential wiring between the first reference potential wiring and the second reference potential wiring,
      a third reference potential wiring formed in the second wiring layer and extending from one of the first semiconductor chip and the second semiconductor chip to the other thereof,
      a fourth reference potential wiring formed in the second wiring layer and extending along the third reference potential wiring, and
      a second signal wiring formed in the second wiring layer and electrically isolated from the first signal wiring, and extending along the third reference potential wiring and the fourth reference potential wiring between the third reference potential wiring and the fourth reference potential wiring,
   wherein the first reference potential wiring is coupled to the third reference potential wiring through a first coupling portion and coupled to the fourth reference potential wiring through a second coupling portion, and has a first crossing portion crossing the second signal wiring between the first coupling portion and the second coupling portion in plan view, and
   wherein the second reference potential wiring is coupled to the third reference potential wiring through a third coupling portion and coupled to the fourth reference potential wiring through a fourth coupling portion, and has a second crossing portion crossing the first signal wiring between the third coupling portion and the fourth coupling portion in plan view.

2. The semiconductor device according to claim 1,
   wherein each of the wirings has a first portion extending along a first direction from one of the first semiconductor chip and the second semiconductor chip to the other thereof, and a second portion inclined with respect to the first direction and thicker in wiring width than the first portion, and
   wherein the first coupling portion, the second coupling portion, the third coupling portion, and the fourth coupling portion are respectively coupled to the second portions of the wirings.

3. The semiconductor device according to claim 1,
   wherein the wirings include a signal wiring through which a signal is transmitted in a first frequency band, and a signal wiring through which a signal is transmitted in a second frequency band higher than the first frequency band, and
   wherein the first signal wiring and the second signal wiring transmit signals therethrough in the second frequency band.

4. The semiconductor device according to claim 3,
   wherein the interposer has a third wiring layer different from the first wiring layer and the second wiring layer, and
   wherein the signal wiring through which the signal is transmitted in the first frequency band is formed at a position overlapping, within the third wiring layer, any of the first reference potential wiring, the second reference potential wiring, the third reference potential wiring, and the fourth reference potential wiring in a thickness direction and along an extending direction of any of the first reference potential wiring, the second reference potential wiring, the third reference potential wiring, and the fourth reference potential wiring.

5. The semiconductor device according to claim 1,
   wherein the wirings which electrically couple the first semiconductor chip and the second semiconductor chip include a plurality of fifth reference potential wirings different from the first reference potential wiring, the second reference potential wiring, the third reference potential wiring, and the fourth reference potential wiring, and
wherein the first reference potential wiring, the second reference potential wiring, the third reference potential wiring, and the fourth reference potential wiring are respectively electrically coupled to the fifth reference potential wirings.

6. The semiconductor device according to claim 1,
wherein the wirings include a third signal wiring formed in a wiring layer other than the first wiring layer and electrically isolated from the first signal wiring and the second signal wiring, and
wherein the first signal wiring has, in plan view, a first crossing portion which crosses the second signal wiring, and a second crossing portion which crosses the third signal wiring.

7. The semiconductor device according to claim 1,
wherein the wirings include a third signal wiring formed in the first wiring layer and extending along the first signal wiring between the first reference potential wiring and the second reference potential wiring, and a fourth signal wiring which is formed in the second wiring layer and electrically isolated from the first signal wiring and the second signal wiring, and which extends along the second signal wiring between the third reference potential wiring and the fourth reference potential wiring,
wherein the first reference potential wiring has the first crossing portion which crosses the second signal wiring and the fourth signal wiring between the first coupling portion and the second coupling portion in plan view,
wherein the second reference potential wiring has the second crossing portion which crosses the first signal wiring and the third signal wiring between the third coupling portion and the fourth coupling portion in plan view,
wherein the first signal wiring and the third signal wiring configure a first differential pair which transmits a first differential signal, and
wherein the second signal wiring and the fourth signal wiring configure a second differential pair which transmits a second differential signal.

8. The semiconductor device according to claim 1, wherein the interposer has a basic material with a semiconductor material as a base material, and
wherein the wiring layers are laminated over a main surface of the basic material.

9. A semiconductor device, comprising:
a wiring substrate;
an interposer mounted over a first surface of the wiring substrate;
a first semiconductor chip mounted over the interposer; and
a second semiconductor chip which is mounted over the interposer side by side with the first semiconductor chip and controls the first semiconductor chip,
wherein the interposer has a plurality of wiring layers including a first wiring layer, and a second wiring layer laminated over the first wiring layer,
wherein the first semiconductor chip and the second semiconductor chip are electrically coupled through a plurality of wirings formed in the wiring layers of the interposer,
wherein the first wiring layer includes:
a first reference potential wiring extending from one of the first semiconductor chip and the second semiconductor chip to the other thereof,
a second reference potential wiring extending along the first reference potential wiring,
a first signal wiring extending along the first reference potential wiring and the second reference potential wiring between the first reference potential wiring and the second reference potential wiring,
wherein the second wiring layer includes:
a second signal wiring electrically isolated from the first signal wiring and extending along the first reference potential wiring,
a third signal wiring electrically isolated from the first signal wiring and the second signal wiring and extending along the second reference potential wiring, and
a third reference potential wiring provided between the second signal wiring and the third signal wiring and extending along the first signal wiring,
wherein the third reference potential wiring is coupled to the first reference potential wiring through a first coupling portion at a position overlapping the first reference potential wiring in a thickness direction, and is coupled to the second reference potential wiring through a second coupling portion at a position overlapping the second reference potential wiring in the thickness direction, and
wherein the first reference potential wiring, the second reference potential wiring, and the third reference potential wiring are respectively bent in areas overlapping a first virtual line linearly passing through the first coupling portion and the second coupling portion.

10. The semiconductor device according to claim 9, wherein in a first area sandwiched between the first semiconductor chip and the second semiconductor chip, the first signal wiring and the third reference potential wiring are provided at a position to overlap each other in the thickness direction, the second signal wiring and the first reference potential wiring are provided at a position to overlap each other in the thickness direction, and the third signal wiring and the second reference potential wiring are provided at a position to overlap each other in the thickness direction.

11. The semiconductor device according to claim 9,
wherein a third wiring layer provided at a layer under the first wiring layer is included in the wiring layers that the interposer has, and
wherein in the third wiring layer in the first area sandwiched between the first semiconductor chip and the second semiconductor chip, a fourth reference potential wiring extending along the first signal wiring is provided at a position to overlap with the first signal wiring in the thickness direction.

12. The semiconductor device according to claim 9,
wherein the wirings include:
a fourth signal wiring formed in the first wiring layer and extending along the first signal wiring between the first reference potential wiring and the second reference potential wiring,
a fifth signal wiring formed in the second wiring layer and extending along the second signal wiring and the first reference potential wiring, and
a sixth signal wiring formed in the second wiring layer and extending along the third signal wiring and the second reference potential wiring, wherein the first signal wiring and the fourth signal wiring configure a first differential pair which transmits a first differential signal, wherein the second signal wiring and the fifth signal wiring configure a second differential pair which transmits a second differential signal, and wherein the third signal wiring and the fourth signal wiring configure a third differential pair which transmits a third differential signal.

13. A semiconductor device, comprising:
a wiring substrate;
an interposer mounted over a first surface of the wiring substrate;
a first semiconductor chip mounted over the interposer;
a second semiconductor chip which is mounted over the interposer side by side with the first semiconductor chip and controls the first semiconductor chip; and
a plurality of external terminals formed over a second surface on the side opposite to the first surface of the wiring substrate,
wherein the interposer has a plurality of wiring layers including a first wiring layer, and a second wiring layer laminated over the first wiring layer,
wherein the second wiring layer has a first wiring which electrically couples the first semiconductor chip and the second semiconductor chip,
wherein the first wiring layer has:
  a second wiring which electrically couples the first semiconductor chip and the second semiconductor chip and is electrically isolated from the first wiring, and
  a third wiring which electrically couples the first semiconductor chip and the second semiconductor chip and is electrically isolated from the first wiring and the second wiring, and
wherein the first wiring crosses the second wiring and the third wiring in plan view.

14. The semiconductor device according to claim 13, wherein a first signal is transmitted to the first wiring at a first frequency, and a second signal is transmitted to each of the second wiring and the third wiring at a second frequency lower than the first frequency.

15. The semiconductor device according to claim 14,
wherein the second wiring layer has a plurality of the first wirings which electrically couple the first semiconductor chip and the second semiconductor chip, and
wherein reference potential wirings are respectively provided between the first wirings.

* * * * *